US008159268B1

(12) United States Patent  
Madurawe

(10) Patent No.: US 8,159,268 B1
(45) Date of Patent: Apr. 17, 2012

(54) INTERCONNECT STRUCTURES FOR METAL CONFIGURABLE INTEGRATED CIRCUITS

(76) Inventor: Raminda Udaya Madurawe, Sunnyvale, CA (US)

( * ) Notice: Subject to any disclaimer, the term of this patent is extended or adjusted under 35 U.S.C. 154(b) by 0 days.

(21) Appl. No.: 12/947,606

(22) Filed: Nov. 16, 2010

(51) Int. Cl.
H01L 25/00 (2006.01)
(52) U.S. Cl. .............................. 326/47; 326/41; 326/101
(58) Field of Classification Search .............. 326/37–41, 326/47, 101
See application file for complete search history.

(56) References Cited

U.S. PATENT DOCUMENTS

| | | |
|---|---|---|
| 4,197,555 A | 4/1980 | Uehara et al. |
| 4,609,986 A | 9/1986 | Hartmann et al. |
| 4,706,216 A | 11/1987 | Carter |
| 4,761,768 A | 8/1988 | Turner et al. |
| 4,864,161 A | 9/1989 | Norman et al. |
| 4,870,302 A | 9/1989 | Freeman |
| 4,873,459 A | 10/1989 | El Gamal et al. |
| 4,933,738 A | 6/1990 | Orbach et al. |
| 5,164,612 A | 11/1992 | Kaplinsky |
| 5,191,241 A | 3/1993 | McCollum et al. |
| 5,343,406 A | 8/1994 | Freeman et al. |
| 5,488,316 A | 1/1996 | Freeman et al. |
| 5,563,526 A | 10/1996 | Hastings et al. |
| 5,581,501 A | 12/1996 | Sansbury et al. |
| 5,625,221 A | 4/1997 | Kim et al. |
| 5,679,967 A | 10/1997 | Janai et al. |
| 5,684,744 A | 11/1997 | Orgill et al. |
| 5,701,233 A | 12/1997 | Carson et al. |
| 5,793,115 A | 8/1998 | Zavracky et al. |
| 5,835,405 A | 11/1998 | Tsui et al. |
| 5,844,422 A | 12/1998 | Trimberger et al. |
| 5,880,598 A | 3/1999 | Duong |
| 5,883,525 A * | 3/1999 | Tavana et al. .................. 326/39 |
| 5,943,574 A | 8/1999 | Tehrani et al. |
| 5,949,710 A | 9/1999 | Pass et al. |
| 6,005,806 A | 12/1999 | Madurawe et al. |
| 6,018,476 A | 1/2000 | Madurawe et al. |
| 6,097,211 A | 8/2000 | Couts-Martin et al. |
| 6,134,173 A | 10/2000 | Cliff et al. |
| 6,191,614 B1 | 2/2001 | Schultz et al. |
| 6,242,767 B1 | 6/2001 | How et al. |

(Continued)

OTHER PUBLICATIONS

Wikipedia [http://en.wikipedia.org/wiki/Application-specific_integrated_circuit], "Application-specific integrated circuit", accessed Nov. 15, 2010.

(Continued)

Primary Examiner — Shawki S Ismail
Assistant Examiner — Thienvu Tran

(57) ABSTRACT

Interconnect structure comprising buffers for a semiconductor device is disclosed. The buffer comprises: an input and an output; and a programmable interconnect structure comprising: a plurality of fixed interconnects including metal and via geometries; and a plurality of selectable interconnect geometries, wherein selecting a selectable geometry connects a first of said fixed interconnects to a second of said fixed interconnects; wherein said input and said output can electrically connect to a subset of said fixed interconnects by the selectable geometries; and a programmable signal restoring unit comprising a plurality of transistors, at least one said transistor having: a common gate region and a common source region; and a first drain region coupled to the buffer output comprising a said fixed interconnect; and a second drain region comprising a said fixed interconnect, said first and second drain regions isolated from each other, wherein a said selectable interconnect geometry can electrically connect the first and second drain regions; wherein, selecting a subset of the selectable interconnect geometries program the buffer input and output connections, and the buffer signal drive strength.

20 Claims, 13 Drawing Sheets

U.S. PATENT DOCUMENTS

| | | | |
|---|---|---|---|
| 6,262,596 B1 | 7/2001 | Schultz et al. | |
| 6,275,065 B1 | 8/2001 | Mendel | |
| 6,331,784 B1 | 12/2001 | Mason et al. | |
| 6,331,789 B2 | 12/2001 | Or-Bach | |
| 6,420,925 B1 | 7/2002 | Fifield et al. | |
| 6,448,808 B2 | 9/2002 | Young et al. | |
| 6,476,493 B2 | 11/2002 | Or-Bach et al. | |
| 6,480,027 B1 | 11/2002 | Ngai et al. | |
| 6,496,887 B1 | 12/2002 | Plants | |
| 6,504,742 B1 | 1/2003 | Tran et al. | |
| 6,515,511 B2 | 2/2003 | Sugibayashi et al. | |
| 6,525,953 B1 | 2/2003 | Johnson | |
| 6,582,980 B2 | 6/2003 | Feldman et al. | |
| 6,613,611 B1 | 9/2003 | How et al. | |
| 6,614,259 B2 | 9/2003 | Couts-Martin et al. | |
| 6,627,985 B2 | 9/2003 | Huppenthal et al. | |
| 6,633,182 B2 | 10/2003 | Pileggi et al. | |
| 6,737,675 B2 | 5/2004 | Patel et al. | |
| 6,738,962 B1 | 5/2004 | Flaherty et al. | |
| 6,798,240 B1 | 9/2004 | Pedersen | |
| 6,911,730 B1 | 6/2005 | New | |
| 6,946,330 B2 | 9/2005 | Yamazaki et al. | |
| 6,954,084 B2 | 10/2005 | Islam | |
| 6,992,503 B2 | 1/2006 | Madurawe | |
| 6,998,722 B2 | 2/2006 | Madurawe | |
| 7,019,557 B2 | 3/2006 | Madurawe | |
| 7,030,651 B2 | 4/2006 | Madurawe | |
| 7,064,018 B2 | 6/2006 | Madurawe | |
| 7,064,579 B2 | 6/2006 | Madurawe | |
| 7,084,666 B2 | 8/2006 | Madurawe | |
| 7,112,994 B2 | 9/2006 | Madurawe | |
| 7,176,713 B2 | 2/2007 | Madurawe | |
| 7,253,659 B2 | 8/2007 | Madurawe | |
| 7,262,633 B1 | 8/2007 | Schmit et al. | |
| 7,268,580 B2 | 9/2007 | Madurawe | |
| 7,586,327 B1 * | 9/2009 | Choe et al. | 326/41 |
| 7,626,419 B1 | 12/2009 | Schmit et al. | |
| 2001/0003428 A1 | 6/2001 | Or-Bach | |
| 2001/0028059 A1 | 10/2001 | Emma et al. | |
| 2001/0047509 A1 | 11/2001 | Mason et al. | |
| 2002/0186044 A1 | 12/2002 | Agrawal et al. | |
| 2003/0001615 A1 | 1/2003 | Sueyoshi et al. | |
| 2003/0023762 A1 | 1/2003 | Dhir et al. | |
| 2003/0085733 A1 | 5/2003 | Pugh et al. | |
| 2005/0023656 A1 | 2/2005 | Leedy | |
| 2005/0091630 A1 * | 4/2005 | Madurawe | 716/16 |
| 2006/0139054 A1 * | 6/2006 | Madurawe | 326/40 |
| 2008/0068041 A1 * | 3/2008 | Madurawe | 326/38 |
| 2009/0243652 A1 * | 10/2009 | Dorairaj et al. | 326/38 |
| 2010/0207660 A1 * | 8/2010 | Madurawe | 326/41 |

OTHER PUBLICATIONS

Wikipedia [http://en.wikipedia.org/wiki/Uncommitted_Logic_Array], "Gate array", accessed Nov. 15, 2010.

Kuan et. al., "Measuring the Gap Between FPGAs and ASICs", IEEE Transactions on CAD of ICs and Systems, V26, No. 2, Feb. 2007, pp. 203-215.

Chau et al., "A comparison of via-programmable gate array logic cell circuits", Proceedings of the ACM/SIGDA International Symposium on Field Programmable Gate Arrays, Feb. 2009, Monterey, CA, USA, pp. 53-62.

* cited by examiner

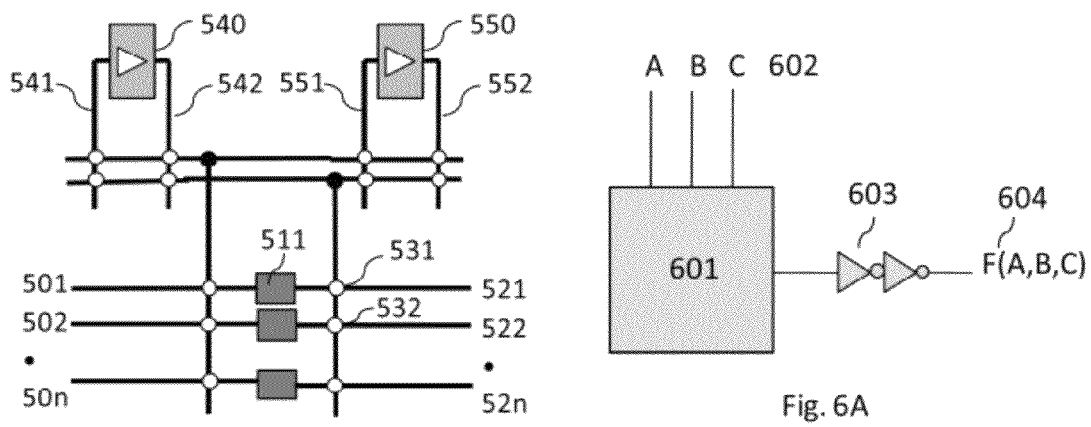
Fig. 5
Fig. 6A
| C\AB | 00 | 01 | 11 | 10 |
|---|---|---|---|---|
| 0 | 0 | 1 | 0 | 1 |
| 1 | 0 | 1 | 1 | 0 |
| Values | 0 | 1 | C | /C |
Fig. 6B
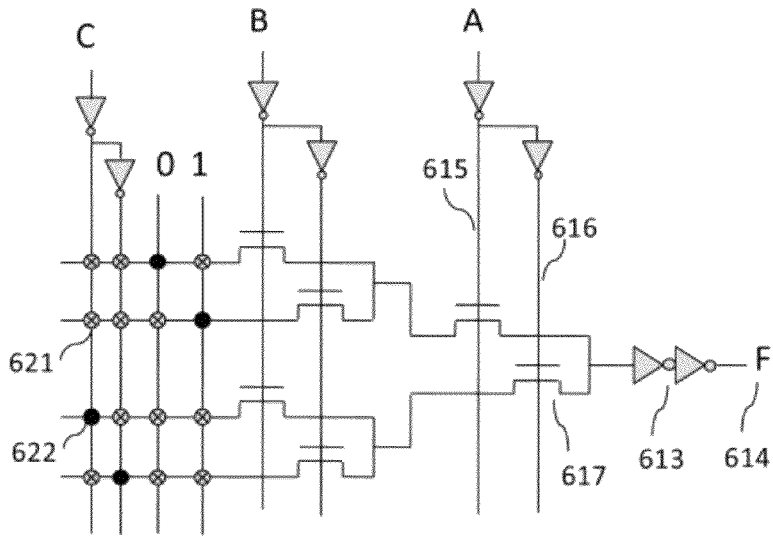
Fig. 6C

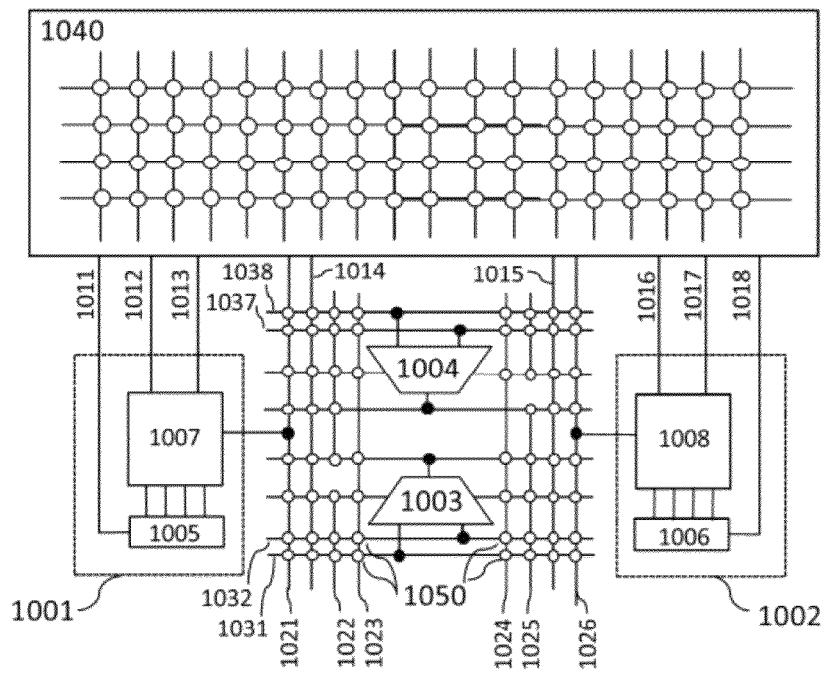
Fig. 10
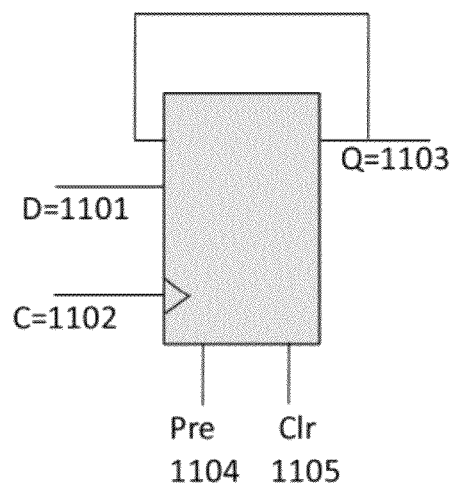
Fig. 11A
| Clk | Clr | Pre | Q |
|---|---|---|---|
| 0/1 | 1 | 0/1 | 0 |
| 0/1 | 0 | 1 | 1 |
| 0 | 0 | 0 | Q |
| 1 | 0 | 0 | D |
Fig. 11B

| Clk | Clr | Pre | $Q_1$ |
|-----|-----|-----|-------|
| 0/1 | 1   | 0/1 | 1     |
| 0/1 | 0   | 1   | 0     |
| 0   | 0   | 0   | $Q_1$ |
| 1   | 0   | 0   | $D_1$ |

| Clk | Clr | Pre | $Q_2$ |
|-----|-----|-----|-------|
| 0/1 | 1   | 0/1 | 0     |
| 0/1 | 0   | 1   | 1     |
| 0   | 0   | 0   | $D_2$ |
| 1   | 0   | 0   | $Q_2$ |

| CD\AB | 00    | 01    | 10    | 11    |       |
|-------|-------|-------|-------|-------|-------|
| 11    | 00 11 | 01 11 | 10 11 | 11 11 | $G_4$ |
| 10    | 00 10 | 01 10 | 10 10 | 11 10 | $G_3$ |
| 01    | 00 01 | 01 01 | 10 01 | 11 01 | $G_2$ |
| 00    | 00 00 | 01 00 | 10 00 | 11 00 | $G_1$ |
|       | $F_1$ | $F_2$ | $F_3$ | $F_4$ |       |

$F_1 = /(/A \bullet /B)$  $G_1 = /(/C \bullet /D)$
$F_2 = /(/A \bullet B)$  $G_2 = /(/C \bullet D)$
$F_3 = /(A \bullet /B)$  $G_3 = /(C \bullet /D)$
$F_4 = /(A \bullet B)$  $G_4 = /(C \bullet D)$

Fig. 13B

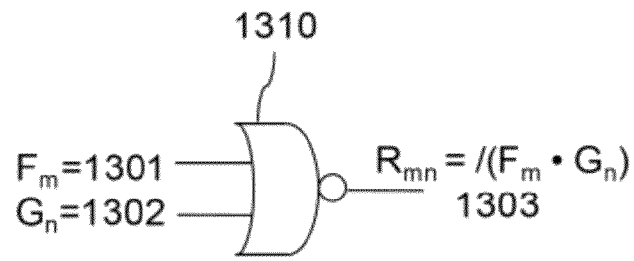

Fig. 13C

If $F_1G_1=00$, $(R_{11})=1$; else $(R_{11})=0$    If $F_2G_1=00$, $(R_{21})=1$; else $(R_{21})=0$
If $F_1G_2=00$, $(R_{12})=1$; else $(R_{12})=0$    If $F_2G_2=00$, $(R_{22})=1$; else $(R_{22})=0$
If $F_1G_3=00$, $(R_{13})=1$; else $(R_{13})=0$    If $F_2G_3=00$, $(R_{23})=1$; else $(R_{23})=0$
If $F_1G_4=00$, $(R_{14})=1$; else $(R_{14})=0$    If $F_2G_4=00$, $(R_{24})=1$; else $(R_{24})=0$ If $F_3G_1=00$, $(R_{31})=1$; else $(R_{31})=0$    If $F_4G_1=00$, $(R_{41})=1$; else $(R_{41})=0$
If $F_3G_2=00$, $(R_{32})=1$; else $(R_{32})=0$    If $F_4G_2=00$, $(R_{42})=1$; else $(R_{42})=0$
If $F_3G_3=00$, $(R_{33})=1$; else $(R_{33})=0$    If $F_4G_3=00$, $(R_{43})=1$; else $(R_{43})=0$
If $F_3G_4=00$, $(R_{34})=1$; else $(R_{34})=0$    If $F_4G_4=00$, $(R_{44})=1$; else $(R_{44})=0$

Fig. 13D

INTERCONNECT STRUCTURES FOR METAL CONFIGURABLE INTEGRATED CIRCUITS

This application is also related to application Ser. No. 12/947,467 entitled "Metal Configurable Integrated Circuits" and application Ser. No. 12/947,565 entitled "Logic for Metal Configurable Integrated Circuits", and application Ser. No. 12/947,589 entitled "Memory for Metal Configurable Integrated Circuits", all of which were filed concurrently on Nov. 16, 2010 and list as inventor Mr. Raminda U. Madurawe, the contents of which are incorporated-by-reference.

BACKGROUND

The present invention relates to interconnect structures for metal configurable integrated circuits.

An application-specific integrated circuit (ASIC) is an integrated circuit (IC) customized for a particular use, rather than intended for general-purpose use (Ref-1). For example, a chip designed solely to run a cell phone is an ASIC. Intermediate between ASICs and industry standard integrated circuits are application specific standard products (ASSPs). As feature sizes have shrunk and design tools improved over the years, the maximum complexity (and hence functionality) possible in an ASIC has grown from 5,000 gates to over 100 million gates. Modern ASICs often include entire 32-bit processors, memory blocks such as ROM, RAM, EEPROM and Flash, analog components, high-speed I/O's and other large building blocks. Such an ASIC is often termed a SoC (system-on-a-chip). Designers of digital ASICs use a hardware description language (HDL), such as Verilog or VHDL, to describe the functionality of ASICs. ASIC designs incur rigorous software testing, very high mask non-recurring-engineering (NRE) costs, and lengthy design, manufacturing and debug turn-around-time (TAT) to get the design working in Silicon. Smaller feature sizes and higher chip integrations make the task very complex.

First ASIC's used gate array technology (Ref-2). Ferranti produced the first gate-array termed the ULA (Uncommitted Logic Array) around 1980. In gate array design, the transistors and other active devices (i.e. logic cells having inputs and outputs) are predefined in array form and wafers containing these un-connected circuits are held in stock prior to metallization. The physical design process then defines the interconnections of the final device. All the inputs and outputs of the logic cells in the gate array are interconnected with one, two to as many as nine metal layers. These metal layers include via geometries in-between metal as well as metal lines. Uehara et. al. and Orbach et al. in U.S. Pat. No. 4,197,555 & 4,933,738 respectively (incorporated herein by reference) disclosed via programmability to connect or disconnect adjacent metal layers. This prior art demonstrates that via geometries between two or more layers can be used to customize gate array products. Or-Bach et. al. in U.S. Pat. No. 6,476,493 (incorporated herein by reference) disclosed M7 and via between M6 & M7 to customize gate arrays. Gate arrays reduce NRE and TAT as only few masks are needed to produce a device. Gate arrays are always inefficient as 100% of the gates can never get utilized due to interconnect inefficiencies due to limitations in metal choices compared to standard cell ASICs. In an array (or sea) of gates, software limitations in the RTL to gate conversion, and metal availability and metal & via interconnect rules all contribute to the gate utilization inefficiency.

Field-programmable gate arrays (FPGA) are the modern-day technology for building a breadboard or prototype from standard parts quicker (U.S. Pat. Nos. 4,870,302; 6,134,173; 6,448,808; 6,992,503; etc., incorporated herein by reference). By altering a "bitstream", programmable logic blocks and programmable interconnects of the same FPGA can be modified to implement many different designs for fast debug and in-system verification. Compared to ASIC's, FPGA's are grossly inefficient: very poor in gate density, performance and power. Benchmarks in Ref-3 show that FPGA's are 40 times lower in gate density (translates to very high cost), 3 times slower in performance (translates to limitations in usage) and 15 times higher in power consumption (problem for hand-held products). In comparisons, prior art gate arrays are only about 3 times more inefficient over ASIC gate densities (Tab-4 of Ref-4 show 3 to 6 times worse). For smaller gate count designs and/or lower production volumes, FPGAs may be more cost effective than an ASIC design even in production. The non-recurring engineering cost of an ASIC can run into the millions of dollars, while the cycle time to get working silicon can be over 6 months. As IC fabrication process geometry gets smaller, the masks costs escalate, and FPGA and gate array alternatives become more attractive.

Disadvantages of FPGA compared to ASIC include the extremely high programmable overhead resources that occupy silicon real estate. A 1-million gate FPGA requires about 20-million extra SRAM configuration memory bits (30-million gates) to configure the device, and about 40-million extra MUX elements (10 million gates) to provide connectivity choices. Compared to ASICs with tens of billions of metallization choices, a 20-million configuration choice is grossly inadequate. It is easy to see the need for ~40 extra gates per useful gate of logic in an FPGA. When logic area is large, the wire distances grow, and "RC" loading grows as square of the distance, leading to poor performance and higher power consumption. The repeating logic block in the FPGA and gate array has better design-for-manufacturing that results in better yields. The larger granularity of the FPGA repeating logic block makes it easier for global routing as the local routing and logic configuration is pre-handled within the logic block. In contrast, in a sea of gates standard cell or gate array ASIC design that uses much smaller grain cells (compared to the FPGA), one needs local connectivity to build logic gates and global connectivity to interconnect logic. Software tools have no concept of local versus global routing. Custom wiring becomes cumbersome, requires expensive tools to extract wire delays, and takes much longer to close timing constraints. Limiting the customization to a few metal layers, especially to upper metal layers such as in U.S. Pat. No. 6,476,493, poses two major challenges. First, a gate array cell library (typically more than one cell) must lend to a compact sea of cell placement with customizability at the pre-selected levels. This difficulty and inefficiency has made gate array products near obsolete in the modern era. The second is a shadowing effect surrounding a used gate; meaning there is a dead zone where gates cannot be wired by the limited wiring choices when only upper level wires are available to customize gates. The second difficulty results in lower gate utilization efficiency, even if the first obstacle is overcome. Hence, density, performance and power of gate arrays are about two or more process nodes worse than standard cells, compared to about four or more process node disparity for FPGAs. Converting an FPGA configuration "bitstream" as in U.S. Pat. No. 6,633,182 (incorporated herein by reference) to vias of a gate array simplifies the design cycle, but lacks the interconnect choices to achieve high gate density.

FIG. 1 shows prior art of constructing gate arrays. From its inception in early 1980's, gate arrays were constructed as an array of transistor cells 101 as shown in FIG. 1A. Each cell 101 comprises a plurality of inputs such as 102, and at least one output such as 103. CMOS transistors include NMOS constructed in P-well, and PMOS constructed in Nwell 113. Rules related to wells and well strapping require ground 111 bus and power 112 bus connections to transistors and wells. The gate array cell may be a NAND gate—in which case input 101 couples a gate electrode, while output 103 couples a diffusion node. Cell 101 could be a mix of different gates having equal dimensions. In this example, horizontal metal tracks 105 and vertical metal tracks 104 and associated via layers are used to customize and complete interconnects. When the customization is complete, metal interconnects traverse from an origin to a destination, they traverse allocated tracks, and go up and down through vias to avoid congestion. Each wire delay must be extracted from the post-routed placement, and simulated to see if the timing constraints of the design are met. Neighboring signals and wires present or absent impacts the time constant "RC" of such wires. Traditional gate arrays provide an array of cells, wherein inputs and outputs are interconnected by customizing via and/or metal layers. As the area of a NAND gate 101 is smaller than the total area of metal above the cell needed to interconnect these cells, not all cells 101 can be utilized, thus the gate density per $mm^2$ of silicon is reduced in these types of devices.

Further draw backs in prior art gate arrays are discussed with respect to FIG. 1B. U.S. Pat. No. 6,476,493 discloses via M6M7 (via between metal 6 and metal 7) and a metal 7 (M7) customizable gate array. In FIG. 1B, a plurality of M5 121, M6 122 and M7 123 provide connectivity to the underlying fabric. They traverse orthogonal directions typical of gate arrays and ASICs. In a 7-layer metal ASIC, there are 7 metal layers and 6 via layers (not counting the contact layer between active/poly and metal 1) to offer interconnect customizability. When only via M6M7 and M7 are customizable, every programmable M1, M2, M3, M4 line/node (not shown) and every M5 line/node (shown) must be pre-coupled to a dedicated M6 node, line segment or line; which significantly reduces the M1-M5 programmable interconnect density. The reduction is non-linear, as every M1 node needs M2-M5 connectivity (thus further reducing available M2-M5 density for routing) to get up to M6. This is a first major draw-back—reduction in useful gate density due to lack of interconnect. The second major draw-back is the unpredictability of timing delay between two nodes. As an example, in an ASIC, interconnect delay between nodal pairs (131, 137) and (141, 147) are identical; they both possess the same distance. In a gate array, the tracks leading to M6 are pre-connected. In connecting nodes 131-137, tracks 132-136 must be chosen. The RC loading is not determined by distance; in this instance the length of each pre-assigned track 132-135 all add up to the delay. Furthermore, length of M7 to couple the two M6 nodes depends on how far apart the two M6 nodes are. In this example, connecting nodes 141-147 is done using metal tracks 142-146. As metal line lengths 132>142, 134>144, and 135>145, the timing delay is grossly mismatched between two identically distanced logic blocks. This disparity causes significant timing closure problems for computer automated tools, and requires expensive "RC" extraction tools and trial-and-error iterations.

The high NRE cost of designing an ASSP product gets amortized by the plurality of users using the IC, whereas one individual user may not be able to justify the design cost. With ASIC and SoC, a single user can justify the NRE costs due to projected large usage volume and return on investment; but such opportunities are rare to find. If the projected usage volume is not realized, the ASIC/SoC investment is a loss. ASIC and ASSP can be categorized as custom-wire technologies, whereas an FPGA can be categorized as generic-wire technology. In custom-wire technologies, the wire delays are highly optimized leading to low power and high performance; but at the cost of very lengthy design cycles, use of expensive tools and high mask NRE. In generic-wire technologies, the wires are pre-fabricated, and wire delays are very poor leading to high power and poor performance; but having the benefit of short design cycles, use of inexpensive tools and low NRE. Thus, low volume applications use FPGAs, high volume multi user applications use ASSP's and high volume single user applications use ASICs.

When a third party IC supplier designs an ASSP for a wide target audience, the final IC does not provide any advantage to a single user above and beyond another. The user has to buy the common ASSP device and design their end product to generate sufficient differentiation to compete in that market place. It is difficult to generate a high value differentiation on the final system using the same IC. FPGA and ASIC provide these differentiation. However, the very high NRE associated with ASICs and the very high unit price of FPGA makes that choice economically very difficult. Embedding an FPGA or Gate Array core within an ASIC/SoC provides programmability; however the gross inefficiencies of an FPGA/Gate Array fabrics is significant, and diminish the ASIC/SoC value.

For the reasons discussed, it is seen that improved configurable fabrics are highly desirable for ASIC/SoC products. Ease of design and productivity are equally important for design efficiency. Previously validated legacy cores (requiring no work) and new cores (requiring significant new work) must be handled through easy to use tools flows. These new cores need design debug, evolve, and often times change during the design cycle. While FPGA's offer this flexibility, it is an over-kill for the fully verified legacy blocks that are already characterized, and it's a poor substitute for the new cores due to poor performance and Silicon utilization.

SUMMARY

In a first aspect a metal programmable core (MpC) and a metal programmable product (MpP) provides the means to customize silicon to a user specification by using one or more metal and/or via masks (hereafter collectively termed customizable metal masks) by a binary method of geometry selection. The customizable metal masks are a subset of all masks required to fabricate the IC, and within the IC the transistor layers and one or more metal/via masks are non-customizable. For simplicity the word MpC is used hereafter to mean both cores and products that are metal programmable. As fewer masks are needed to modify the design within the MpC, the NRE is significantly lower than for a full custom ASIC or all layer ASSP, and as only some of the back-end metal layers need to be fabricated, the silicon fabrication TAT is substantially reduced. Such an MpC is designed to provide design-for-manufacturability (DFM) by one or more repetitive silicon structures within the core that yield very high gate density, very high performance, and consume very low power compared to an embedded FPGA or metal programmable gate array core. In a first example, the gate density may be 25 times higher than FPGAs, performance may be 2.5 times faster, and the power may be 10 times lower than in an embedded FPGA core. In a second example, the comparisons metrics may be even closer to a standard cell ASIC implementation based on how well the tools flows (such as synthesis, place and route) are able to map designs into the MpC fabric. With these metrics, an MpC embedded in an ASIC or ASSP enable users to customize silicon at a tiny fraction of the full ASIC NRE and TAT without losing density, performance or power advantages; a capability not realizable with existing embedded FPGA or gate array cores. Furthermore, a user interface tool completes the pack, place and route of a synthesized netlist into the MpC satisfying pre-determined timing constraints to identify a "bitstream" (a string of zeros and one) that fully customize the metal masks. In such a select-routable MpC fabric, the bitstream design closure offers much faster timing closure at a much lower tools cost as expensive CAD tools that extract "RC" parameters from precisely tuned standard cell libraries and manufacturing processes (used in ASIC and gate arrays) are eliminated.

Advantages of the above include one or more metal programmable cores (MpC) embedded in an ASSP or ASIC to provide customization by individual users even when the IC is targeted as a common product. The one or more cores are optimally placed within the SoC and interfaced to each other through bus interfaces within the SoC. The MpC includes programmable logic, memory, and interconnect, all programmable by the customizable metal masks. Any user design may be ported to the MpC by simply configuring the few mask layers that needs customization. ASIC and FPGA tools flows synthesize, pack, place an route VHDL designs similar to how designs are implemented in the IC industry today. Bus interface between SoC components and MpC cores allow users to stitch said cores together, which enable users to push undefined or changing design needs to the MpC (which can be configured late in the design cycle) to get an early start on the SoC, thus saving valuable design TAT, and saving NRE costs should the MpC content change. MpC cores may also include DSP, I/O, analog components, PLL, clocks and other programmable content. A signal going into or coming out of a said MpC core may be coupled to an I/O of the IC, or as an input or output to one or more IP cores within the SoC. The MpC core may comprise programmable interconnects to route external and clock signals through the MpC core. Thus an embedded MpC core within an SoC provides users the capability of enhancing efficiently designed standard functions with very efficient user programmable IP at early start, lower NRE, lower unit cost, faster TAT, higher performance, and lower power.

In a second aspect, a metal programmable product (MpP) is provided as an alternative to field programmable gate array (FPGA) for users to customize the design during manufacturing to achieve a significant cost, power, performance benefit over FPGA and to achieve much lower NRE and TAT over an ASIC/ASSP/SoC. Such a device can be very complex as the MpP gate density, power and performance metrics are very near ASIC metrics at only a fraction of the upfront penalty. An MpP based SoC can combine FPGA content and ASIC content within a single device very effectively. For example, advanced SoC capabilities such as microprocessor cores, high speed I/Os, memory, high speed DSP, and analog functions and advanced FPGA capabilities such as parallelized data processing, customizable memory, customizable I/O, soft-configurable microprocessor cores & DSP cores can be merged into a single fabric further having power reduction and clock gating and performance optimization techniques not found in FPGA or gate array fabrics.

Advantages of the above include one or more metal customizable IP cores combined with custom IP blocks, memory, DSP, high performance I/O, analog and other typical SoC related IP, interconnected to each other through a programmable interface and bus structures a single MpP. An MpP offers 35× better logic efficiency, 12× lower power and 2.5× better performance over equivalent process node FPGA's; an advantage that FPGA's simply cannot deliver even at a 4× smaller process geometry node. For example, a 65-nm MpP will have better value over a 10-nm FPGA. An MpP will require 85% less mask NRE, and a 2× faster fabrication cycle TAT over an ASIC; in addition to improvements in productivity through FPGA-style design techniques. Typical ASIC/SoC designs are unable to run efficiently in FPGA's due to extremely poor performance within the FPGA and the mismatch between ASIC and FPGA design methodologies (for example ASICs optimize and place complex clocks and clock domains, whereas FPGA's have inbuilt clocks and clock domains); such difficulties resolved in an MpP as both design tools flows will efficiently map designs into the hybrid IC.

In another aspect, an MpP includes a fixed layout of a metal customizable circuit block that a user may be able to configure into a myriad of functions, wherein each function is programmed by a binary decision of selecting or not selecting a fixed geometry to be included in the circuit. In a first example, a via geometry may be included to couple two vertically crossing metal lines at the point of crossing, or not included to keep the two metal lines isolated. In a second example, a metal tab may be included to couple a first metal line to a second metal line within the same metal layer, a layer above or a layer below. The advantages of this include the following. A bitstream may be generated to identify each of the geometries that must be included or excluded in the design. A simple bit definition of "1" may indicate "inclusion" while a bit definition "0" may mean "exclusion". Clearly the bit pattern can be reversed, and a plurality of geometries can be assigned to a single bit. A pack, place and route tool can simply generate a bit pattern based on a fully routed, optimally packed and placed logic netlist. The bitstream concept avoid the need to use of "RC" extractions of fully placed and routed netlist, and verifying by trial and error if timing constraints are met in the apriori placement. The bitstream concept may further include power reduction, clock gating and signal isolation mechanisms (some of them used by ASIC tools through circuit techniques and not through programmable techniques). A first or second (lower than said first) power supply voltage may be coupled by a programmable via or metal tab to power a non-performance critical circuit to reduce power. A metal line positioned adjacent to a performance critical signal line may be programmed by a via or metal tab to an isolation line to enhance signal integrity. Individually programmable logic blocks comprising individually configurable registers (as opposed to pre-positioned registers) may be included or excluded from clock domains to include only registers used in the design, and substantially reduce clock loading. Clock edges may be programmed by clock changing buffer strengths or tunable delays to improve circuit performance. Such MpP's offer one or more of: lower cost, lower power, higher performance, better reliability, avoid single bit upset, instant power up, lower NRE, faster TAT, and improved productivity.

In yet another aspect a metal programmable logic unit comprises a plurality of logic structures and a local interconnect fabric, wherein local metal programmability allows the logic unit to be configured into a plurality of usages. In a first instant, the logic unit may be fully filled as multiple identical sized logic functions; in a second instant, the logic unit may be fully filled as multiple varied sized logic functions; in a third instant, the logic unit may be use to include a latch function in addition to logic; and in a fourth instant, the logic unit may be use to include a flip-flop or register function in addition to logic; and in a fifth instant, the logic unit may facilitate carry-logic. A single logic unit is easy to array in a compact form; and having a variety of packing options improve the gate density of the fabric. High logic packing reduces the distance between logic, lowering power consumption and improving performance. The capability of using the same logic unit for logic and registers eliminate wastage of dedicated prepositioned registers, optimally places registers close to logic when and where needed, reduces loading on clock trees, and improves power and performance.

In yet another aspect a metal programmable memory block comprises a cell that is easily arrayed, the cell further comprising an internally generated decode signal that is unique to the cell. The cell array further comprises a common column decode line, and a common row decode line, and each said cell comprises a logic block that receives the column decode and the row decode signals to generate said unique decoded signal. The cell array further comprises a write-mode to random access a cell in the array and change data stored in that cell; and a read-mode to random access a cell in the array and read the data value stored in that cell; and a shift-mode to shift data from a first bit in the array to an Nth bit (N is an integer greater than two) in the array. In a first instant, a column or row of memory units is structured into an array for efficient integration with other logic cells to improve gate density of the metal programmable fabric. In a second instant, a plurality of memory requirements is fulfilled with a single memory block, thus minimizing the cell count required for efficient SoC construction. In a third instant, an array of memory units share write and read metal tracks to increase metal tracks needed for metal programmability. In a fourth instant, the latch is not disturbed during read mode, the latch can be written and read during the same clock cycle, and the latch comprises minimum transistors. In a fifth instant, the shift-register mode does not require a first latch to fight a second latch to alter the data state; instead it only needs to drive high-impedance nodes.

In yet another aspect, a metal programmable buffer structure offers varying drive strengths for the tool to pick the optimal drive strength by a bitstream selection. The buffer comprises a transistor width enhancement by selecting a via or a metal geometry. A plurality of buffer structures further comprises combining two or more buffers together to increase the options on drive strength. For example, two buffers, each buffer having two drive strengths, may be combined to offer 5-possible drive strengths, thereby enhancing timing optimizations for driving wire loads in the software tool. In yet another aspect, a plurality of wires can be selectively coupled to an input and an output of a buffer structure, wherein any signal on any one wire can be buffered and transmitted to any other wire. In yet another aspect, a first plurality of wires are capable of selectively coupling to a second plurality of wires; and both said pluralities of wires are further capable of selectively coupling to an input and an output of a buffer structure, wherein a signal in the first plurality of wires may be coupled to a wire in the second plurality of wires either buffered or un-buffered. In a first instant, the programmable buffer structures provide fast timing closure of an automated timing closure engine. In a second instant, a programmable buffer structure offers a plurality of bi-directional wire coupling choices. In a third instant, an interconnect fabric provides buffered and un-buffered metal programmable wire coupling. In a fourth instant, a fixed interconnect fabric accesses programmable buffer structures to improve a wire delay characteristic.

Thus a "bitstream" style metal programmable fabric improves productivity and efficiency of the user to implement previously proven (no risk) cores in standard cells, and new (high risk) cores in metal programmable cores, thereby lowering NRE costs and TAT to get the system fully debugged and characterized.

BRIEF DESCRIPTION OF THE DRAWINGS

FIG. 5 shows a plurality of variable drive strength metal programmable buffer structures.

FIGS. 6A-6C shows metal programmable multiplexer (MUX) logic block in the current invention.

FIG. 10 shows a local interconnect structure for high gate utilization of metal configurable logic.

FIGS. 11A-11C shows latch construction using a standard metal programmable logic (MPL) unit.

FIGS. 12A-12C shows flip-flop construction using a plurality of metal programmable logic units.

FIG. 13A-13D shows memory string conversion to row and column based compact arrays.

DESCRIPTION

Figure 1A:
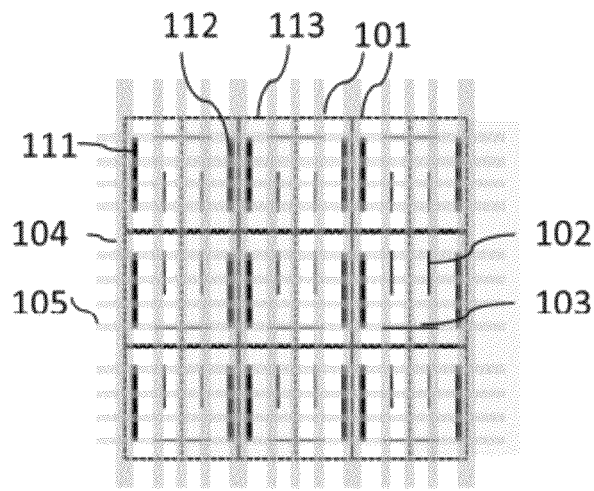
FIGS. 1A-1B shows prior work in via and metal (collectively termed metal) programmable logic.
Figure 1B:
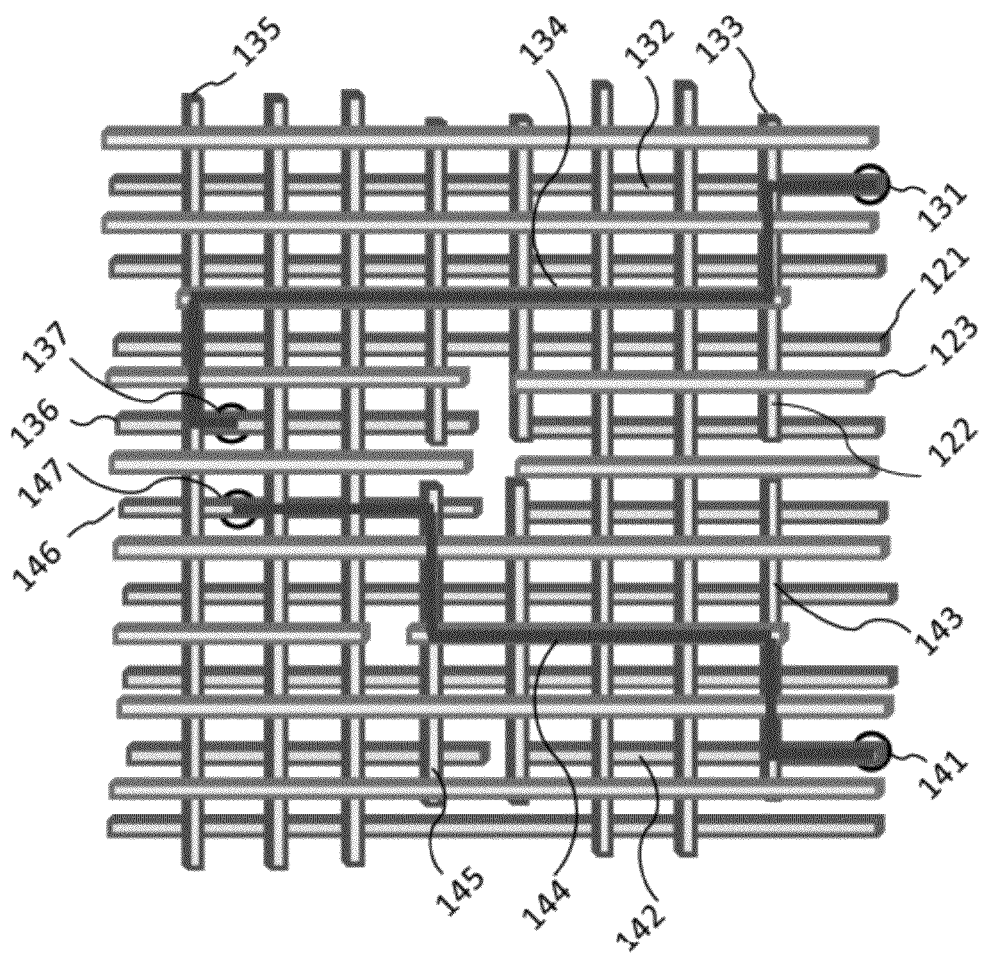

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The term layer is defined as a material layer caused by a processing step used in semiconductor fabrication. A layer may comprise a single masking step or a plurality of masking steps. For example, a metal layer may be a single metal film, deposited patterned and etched, or a plurality of metal layers coupled to each other by via layers. Thus a layer has a first surface and a second surface above said first surface, and may include other surfaces in-between. A layer may not have a visible surface, and a layer may penetrate inside another layer. For example, an implant layer may penetrate into silicon wherein the bottom implant surface is within silicon and not visual, while the top surface may be the silicon surface. An oxide layer may fill the gaps between metal lines and comprise a bottom surface matched with a bottom metal surface, but have a top surface above the metal top surface. The terms wafer and substrate used in the following description include any structure having an exposed surface with which to form the integrated circuit (IC) structure of the invention. The term substrate is also used to refer to semiconductor structures during processing, and may include other layers that have been fabricated thereupon. Both wafer and substrate include doped and un-doped semiconductors, epitaxial semiconductor layers supported by a base semiconductor or insulator, SOI material as well as other semiconductor structures well known to one skilled in the art. The term conductor is understood to include wires, refractory metal, silicide material, polysilicon and semiconductors, and the term insulator is defined to include any material that is less electrically conductive than the materials referred to as conductors. An NMOS transistor is known to have an N-type conducting channel, and a PMOS transistor is known to have a P-type conducting channel. A multiplexer (MUX) is defined as an electronic device comprising at least two regular inputs, at least one select input and at least one output. The select input is received in true and compliment levels. In a 2:1 MUX couples one of said two regular inputs to the output based on the state of the select input. A 4:1 MUX has four regular inputs and two select inputs, and the select input couple one of four regular inputs to MUX output. A MUX may be constructed with NMOS transistors, or both NMOS and PMOS transistors. A look-up-table (LUT) is defined as an electronic device that comprises a plurality of LUT values, a plurality of select inputs and at least one output. The LUT values are zeros or ones, and the select inputs couple a LUT value to the LUT output. It is understood that LUT values are hard-wired or stored in registers. An inverter receives an input signal and generates an output signal of opposite polarity. A buffer is defined as an electronic device that has an input and an output, and a weak signal received at the input is buffered and a strong signal is transmitted at the output. It is understood that the buffer has the same signal polarity between the input and the output, and that a buffer has an intrinsic signal transit delay. A voltage restoring device is defined as an electronic device that receives a signal at a degraded voltage level and generates an aggraded voltage level. The following detailed description is, therefore, not to be taken in a limiting sense.

Figure 2A:
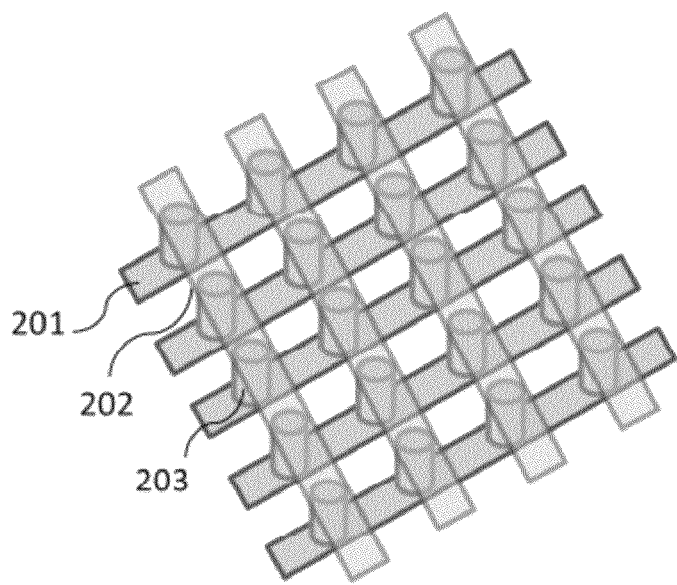
FIGS. 2A-2C shows metal programmable structures for use in the current invention.
Figure 2B:
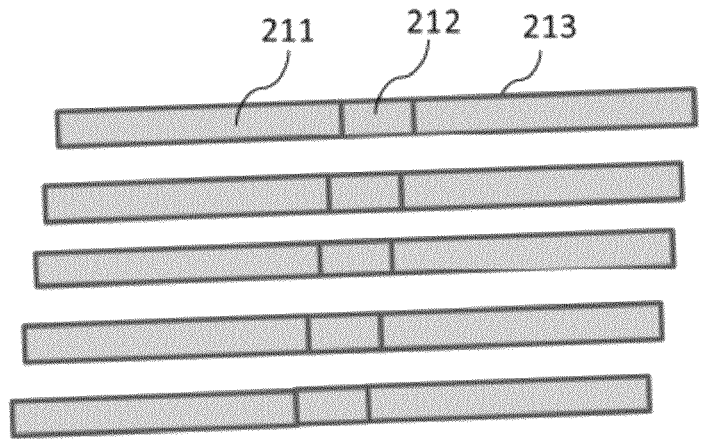
Figure 2C:
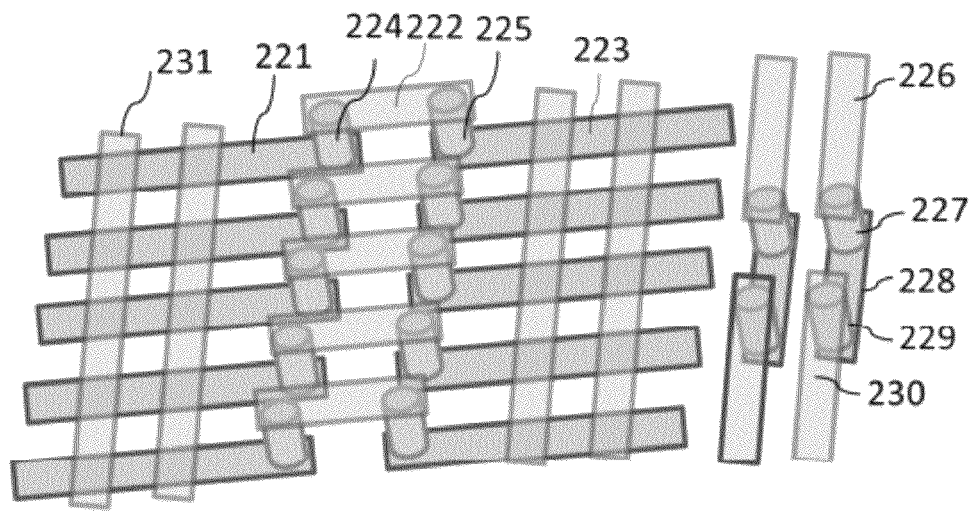

FIG. 2 shows a basic selectable and fixed interconnects used to construct high logic density metal programmable devices according to this invention. FIG. 2A shows a via programmable cell; where simple insertion of a via 203 makes a connection between a first fixed metal line 201 and a second fixed metal line 202. Each via 203 (or a group of vias) is assigned a bit identity by a bit in a bitstream; a bit "1" includes the designated via in the selection, while a bit "0" excludes the designated via from the selection. In such a via layer, a plurality of via's not shown in FIG. 2 are permanently included, for example, via that simply provide a non-programmable connections. FIG. 2B shows a simple metal programmable cell; where simple insertion of metal tab 212 couples a first fixed interconnect 211 to a second fixed interconnect 213. Each metal-tab 212 (or a group of metal tabs) is assigned a bit identity by a bit in a bitstream; a bit "1" includes the designated metal tab in the selection, while a bit "0" excludes the designated metal tab from the selection. In such a metal layer, a plurality of fixed metal lines 211 and 213 are permanently included, and only the selected metal tabs are included in the customized mask. Wire length extension in two metal layers by a single selectable via is shown in FIG. 2C. A fixed metal interconnect wire 221 in a first metal layer is coupled to a second fixed interconnect wire 223 in the same layer using a metal jumper 222 in a second metal layer by selectable via 224 & 225. In FIG. 2C, the metal jumper 222 is also a fixed interconnect track, and only the selection of via 224 and 225 is permitted. In this example, the corresponding bit in the bitstream selects two via geometries 224 and 225 to be selected if wire 221 needs to be coupled to wire 222 during the routing phase of the design automation tool; and it is accomplished by changing the bit value from an original zero (not selected) to one (selected). Similarly, second metal layer wires 226 & 230) are coupled by a first metal layer jumper 228 by selectable via 227 & 228.

Advantages of fixed metal interconnects in FIG. 2 include each fixed wire in a given direction having a substantially identical length. Each metal wire segment also has substantially identical neighbor wires. In one embodiment, each fixed interconnect span a unit cell, the unit cell being a repeating logic block used to create the array of logic. The cell X-dimension and Y-dimension need not be the same. Each metal segment in a given direction comprises similar resistance R and similar capacitance C values; hence the wire time constant defined by "RC" is similar. One familiar in the art will note that "RC" is proportional to the square of wire length ($L^2$). When a first wire is coupled to a second wire directly, to first order, the wire length is increased to 2L, hence the new RC time constant is ~$4L^2$; an increase of four times. Addition of buffers to signal lines is necessary to minimize the degradation of delay times in long wires. Exact wire delay can be easily extracted from a simulation file and provided to a timing model included in a computer aided design tool that uses timing estimates to converge on optimal logic placement and routing choices to satisfy a user specified timing constraint file. As the wires are stitched with either via or metal tabs, the resulting new wire delay can be easily predicted with this scheme.

Figure 3:
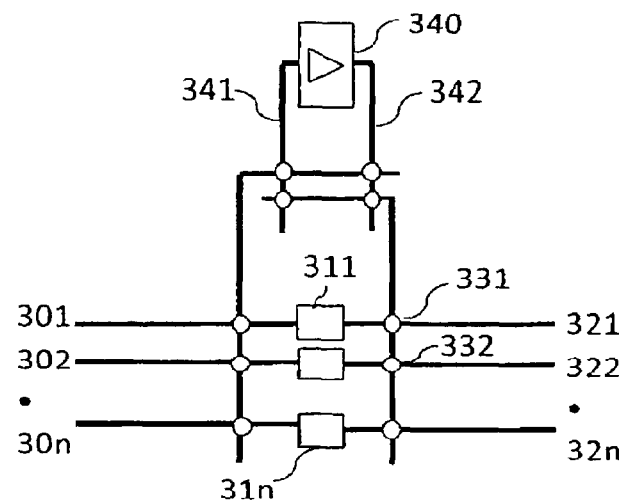
FIG. 3 shows a metal programmable buffer structure with programmable drive strengths.

FIG. 3 shows a fixed and selectable interconnect structure used in this invention. In FIG. 3, a first set of fixed interconnects are shown as 301-30n, and a second set of fixed interconnects are shown as 321-32n. Also shown are selectable metal tabs 311-31n, and selectable vias such as 331. It is easily seen that metal tab 311 may be substituted by a metal jumper as shown in FIG. 2C, in which case a via selection can accomplish the same end result. A buffer structure 340 has an input 341 and an output 342. Fixed metal wire 301 may be coupled to fixed wire 321 by selecting metal tab 311. This is a direct programmable coupling; and the time constant of the resulting wire is increased by about 4-times. The advantage of FIG. 3 includes an alternative programmable coupling option for wires 301-30n. Any wire 301-30n and 321-32n can be coupled to the input 341 or output 342 of buffer 340 by suitable selection of a plurality (four as shown in diagram) vias such as 331 and 332. The total two wire delay time is determined by 2*Twire+Tbuf, where Twire is the wire delay per segment and Tbuf is the buffer delay. The programmable selection offers insertion of bi-directional buffers to any wire segment for an automated routing tool to pick and chose when the timing must be optimized; a decision made by selecting a bit in a bitstream to accomplish the timing improvement.

Figure 4:
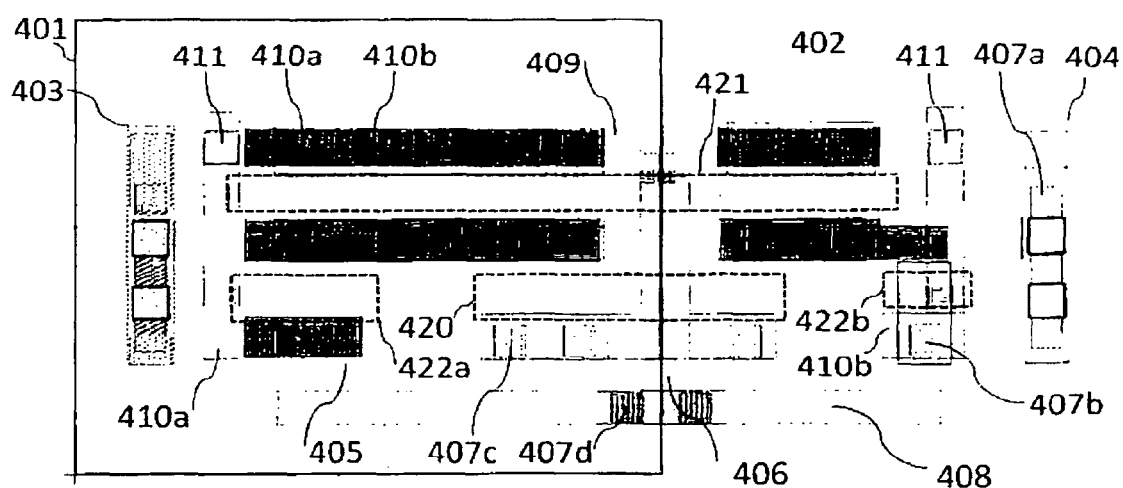
FIG. 4 shows a layout of a variable drive strength metal programmable buffer structure.

FIG. 4 shows a metal configurable buffer structure used in this invention, wherein the buffer drive strength can be programmed by a CAD tool by selecting a bit in a bitstream. The buffer layout shown uses layout style familiar to one in the art of circuit layout. A buffer includes PMOS devices arranged inside Nwell region 401, and NMOS devices arranged inside Pwell region 402, which is outside of said Nwell. Nwell's need an Nwell tap 403 coupled to Vcc (power rail), while Pwell needs a Pwell tap 404 coupled to Vss (ground rail). Both transistor types utilize diffusion geometries such as 405, and poly geometries such as 406. Contacts (407) couple diffusion, taps and poly to first metal (408). All said geometries thus far are fixed geometries in the device. In a first embodiment, via between metal-1 and metal-2 comprise fixed geometries 410, and selectable geometries 411. The CAD tool & bitstream recognizes the two via 411 as selectable objects; by activating the corresponding bit, the buffer shown in FIG. 4 is programmed to deliver a higher drive current. Buffer in FIG. 4 has a first stage 420, and a second stage 421. In a first state, the buffer drive strength is determined by the width of NMOS & PMOS devices in stage 421. When via pair 411 is selected, the driver acts in a second state, wherein the sum of stage 421 and stage 422 (shown as 422a for PMOS, and 422b for NMOS) provide the drive. In the second state, the effective width of NMOS and PMOS transistors are larger resulting in a higher drive current. The advantages of FIG. 4 include the bit-level programmability of drive currents to optimize timing parameters within an automated tool. One familiar in the art will recognize that the same concept can be extended to provide multiple drive strengths in bit-programmable buffer structures.

Thus, the programmable buffer of FIG. 4 comprises: an input 408 and an output 409; and a programmable interconnect structure comprising: a plurality of fixed interconnects including metal and via geometries (406-410); and a plurality of selectable interconnect geometries (411), wherein selecting a selectable geometry connects a first of said fixed interconnects to a second of said fixed interconnects; wherein said input and said output can electrically connect to a subset of said fixed interconnects by the selectable geometries; and a programmable signal restoring unit (transistors of FIG. 4) comprising a plurality of transistors, at least one said transistor having: a common gate region and a common source region; and a first drain region coupled to the buffer output comprising a fixed interconnect; and a second drain region comprising a fixed interconnect, said first and second drain regions isolated from each other, wherein a said selectable interconnect geometry can electrically connect the first and second drain regions; wherein, selecting a subset of the selectable interconnect geometries program the buffer input and output connections, and the buffer signal drive strength.

FIG. 5 shows an extension of the metal programmable buffer structure shown in FIG. 3 for use in this invention. Advantages of FIG. 5 includes, two (or more if necessary) metal programmable buffer structures 540 and 550 coupled to the fixed and selectable interconnect structure. Each buffer structure is similar to FIG. 3, and is not explained here. However, both buffer structures can be coupled in parallel to a given wire segment to double the drive strength. If each buffer structure 540 and 550 is similar to that described in FIG. 4, it is easy to see the two buffers offer 5 different drive strengths selectable by bit identification. In addition, the structure in FIG. 5 offers two independent signals that can be buffered, a choice that is useful in resource optimization. One familiar in the art will recognize how to offer a plurality of buffer structures in a similar manner such that they can be used individually, or in tandem, to enhance bit-level programmability for CAD tools to pick and chose the best condition to optimize a timing or resource utilization solution.

FIG. 6 shows a metal programmable logic element used in the current invention. FIG. 6A represents the logical representation of the logic element, comprising a plurality of inputs (602) and at least one output 604. The output may be buffered by an output buffer 603. This is a multiplexer based logic element, also referred as a look-up-table based logic element. There are look-up-table values (not shown), and for any combination of inputs, one of the look-up-table values is obtained at the output 604. Any logic function of three input variables can be programmed into the logic element by simply programming the look-u-table values. An example of one specific 3-input function is shown in the truth-table of FIG. 6B. One specific implementation shows that 4 look-up-table values comprising logic "0", or "1", or "C" or "notC" are capable of programming a two-stage multiplexer tree to generate the function. The gate level implementation of function in FIG. 6 is shown in FIG. 6C. Each of the inputs A, B & C is provided in true and compliment to the logic element. Selectable vias such as 621 provides the programmability to the logic element. Selecting via 622 couples notC (denoted /C) to the A and B input states as shown in the last column of FIG. 6B. Such a customization does not require metal wires, and can be done very close to the transistor layer in silicon (such as via between metal-1 and metal-2). In one embodiment, the selection is made by a via layer between metal-1 and metal-2; and in other embodiments this is done at a via layer between metal-2 and metal-3, or by a metal-2 tab at metal-2 layer.

Figure 7:
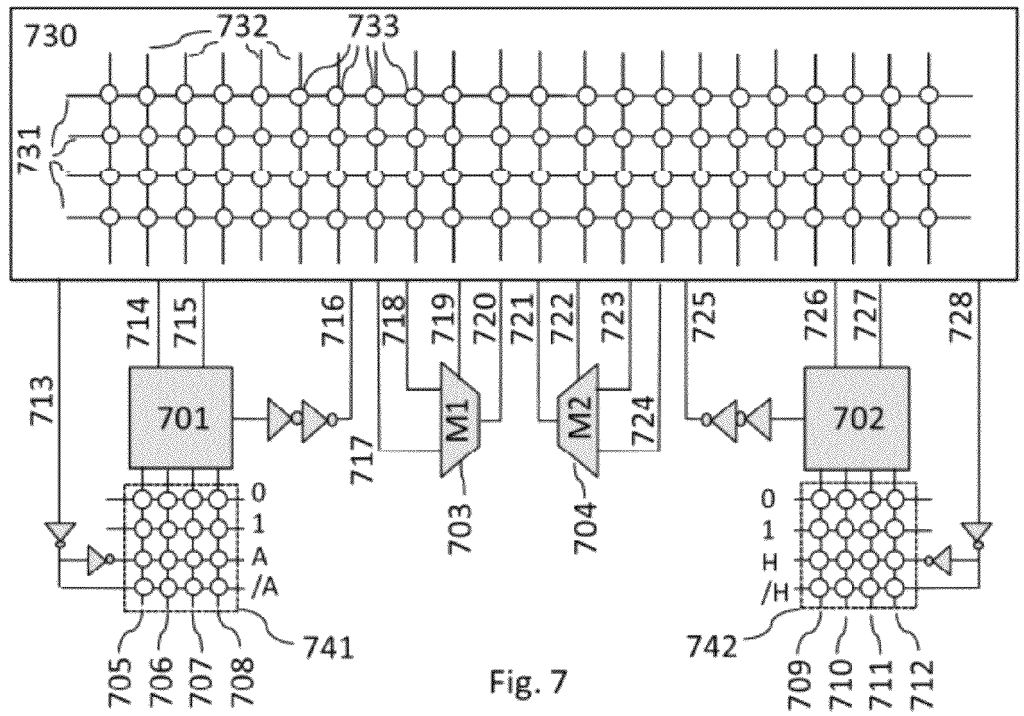
FIG. 7 shows a first logic unit to achieve high gate density in the current invention.

FIG. 6 shows a preferred embodiment of a logic element for metal programmable logic. The advantages of it will show during the description provided below. The logic element comprises two major components: programmable logic and interconnect, both configured by metal. First the logic content will be described. As stated earlier, a look-up-table (LUT) logic block is a multiplexing circuit. FIG. 7 contains two LUT elements 701 and 702, and two multiplexer elements 703 and 704. LUT 701 is arranged to have two select inputs 714, 715 and four inputs 705-708. In this arrangement and logic decomposition, an input 713 in true and compliment form together with logic zero and one are provided as an inputs to the LUT 701. Each of the four inputs can be independently programmed to any one of the four signals. A metal programmable connection block 741 allows bit-selectable programmability of the LUT 701 to support any function of 3-inputs, or namely F(A, B, C). LUT 701 has one output 716, which is internally boosted for signal strength. LUT 702 is similar to LUT 701. Combined, LUTs 701 and 702 can handle 6-independent inputs, and generate two outputs. Multiplexer (MUX) 703 has one select input 719, and two regular inputs 717, 718, and one output 720. MUX 704 is similar to MUX 703. The logic block in FIG. 7 comprises 12 inputs and 4 outputs. Inputs are: 713-715, 717-719, 722-724, 726-728. The outputs are: 716, 720, 721, 725. All inputs and output couple to an interconnect connection box 730. Connection box 730 receives horizontal interconnects 731 of substantially the same length; and vertical interconnects 732 of substantially the same length. The wire "RC" for each horizontal wire segment is similar to other horizontal wire segments. Similarly, the wire "RC" for each vertical wire segment is similar to other vertical wire segments. Thus the delay characteristic in each of the directions is common regardless of wire selection. While not shown in FIG. 7, the inputs 717, 718 to MUX 703 and inputs 723, 724 to MUX 704 are allowed to couple to logic 0 and logic 1 (as shown for LUT 701 inputs 705-708). Through the connection box, the MUX inputs are capable of connecting to any, inputs and outputs. As a result, the logic block provides a "macro" LUT function that can be used to build larger logic functions, without the need to use global interconnects; which is a significant factor to achieving high logic density in this invention. A second benefit is that LUT 701 and MUX 703 can be used to construct a latch; another significant factor to improve the logic density in this invention. It is trivially seen that the two LUTs 701 and 702 can be combined with either of the MUXs 703 or 704 to construct a 4-input LUT; a fact hardly surprising as it is known to one in the art that. LUTs are simply MUX trees. However, a novelty in this logic element is LUT 701 and MUX 703 can be programmed to build a first latch; LUT 702 and MUX 704 can be programmed to build a second latch;

and the two latches can be combined to build a flip-flop. Thus no dedicated registers are required in this invention; the user simply use the building block to place logic and registers as needed to achieve very high density placements, reduce cost, reduce power and improved performance.

Figure 8:
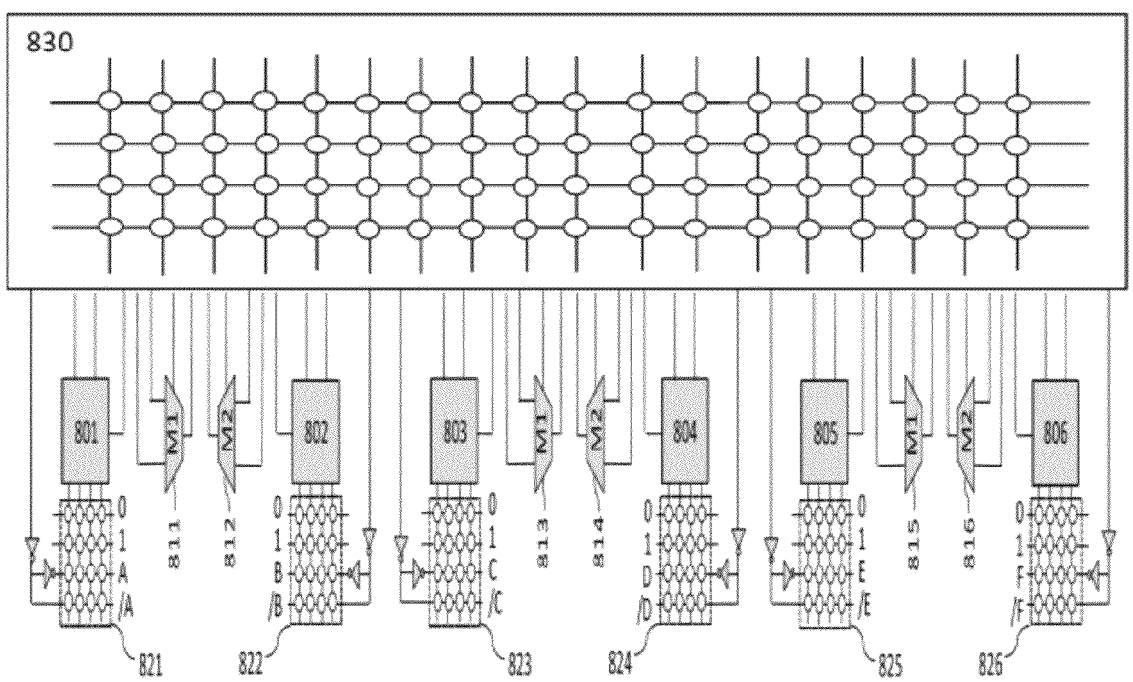
FIG. 8 shows a second logic unit to achieve high gate density in the current invention.

FIG. 8 shows a logic unit that is comprised of a plurality of logic elements as shown in FIG. 7. For illustrative purposes, a preferred 3-element logic unit is shown in FIG. 8, however building blocks comprising more or less than three may be constructed along the principles discussed here. A first advantage with this larger cluster of logic is that the logic content is made bigger than the individual components. Output of a first logic element may be used as an input to a second logic element, thereby reducing global wires needed for interconnects, reducing power and improving performance. A larger collection of logic elements offer a higher number of logic packing choices, and the logic unit in FIG. 8 is design to benefit by such choices. A second advantage is that the logic enhancement is done at a local level which increases the logic granularity without losing efficiency, and simultaneously making it simpler for CAD tools to route complex designs to close timing. In a first packing example, logic blocks 801-806 are utilized to implement six 3-input functions, while MUX elements 811-816 are utilized to implement two 2-input functions. In a second packing example, logic blocks 801-804, 811-813 are utilized to implement one 5-input function, and logic blocks 805-806, 815-816 are used to implement one 4-input function or a flip-flop. One familiar in the art will easily recognize many other partitioning of logic that can be easily fitted into the logic unit shown in FIG. 8. Thus in a more compelling aspect, the metal programmable logic shown herein offers very high logic density utilization (hence lower cost) compared to standard gate array, or FPGA products, in addition to better performance, lower power and easier routing and design closure.

Figure 9A:
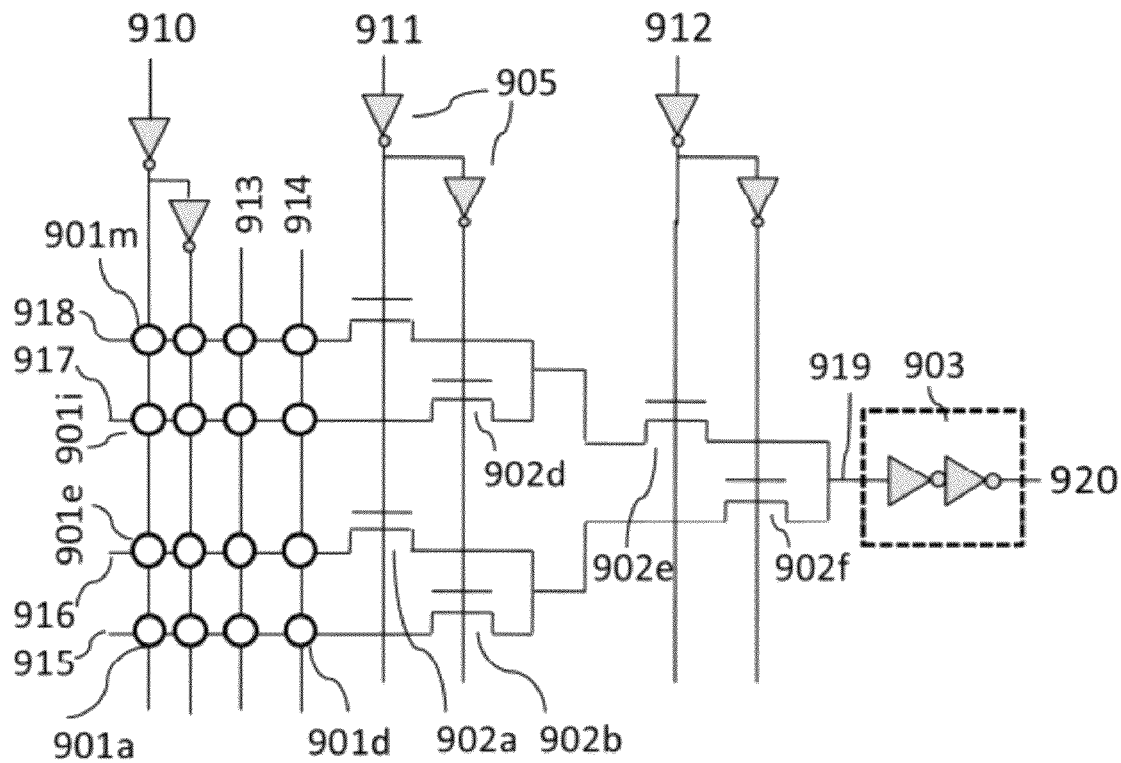
FIG. 9A shows a high gate density MUX circuit with low power signal restoring circuit.

The 3-input LUT structure shown in FIG. 6C can be viewed as a MUX tree. This is shown in more detail in FIG. 9 and discussed here. In FIG. 9A, the MUX tree has two select inputs 911 and 912, both received in true and compliment levels. The levels are internally generated by standard inverters such as 905 from any signal input received into the logic element. The illustrated MUX tree uses six NMOS transistors 902a-902f. In other embodiments these may be CMOS transmission gates, composed of NMOS & PMOS pairs driven by gate voltage levels having the appropriate signal polarity. NMOS construction consumes much less space (hence higher gate density) due to the 50% lower transistor count as well as eliminating latch-up related high Nwell to Pwell spacing. The MUX tree has four regular inputs 915-918. Unlike a regular LUT logic block, the regular inputs are not zero and one; it could be a logic level provided by input 910 at true or compliment logic level. The appropriate input values for 915-918 are metal-programmed by selecting four out of sixteen programmable connections 901a-901p. These input values are also called look-up-table (LUT) values; in this instance these are one of 0, 1, C or /C (not C). Select inputs 911 and 912 couples one of the LUT values to output 919. With NMOS construction of MUX trees, data level one at output 919 is degraded due to the threshold voltage drop, which is further enhanced by the back-bias effect, which is well known to one familiar in the art. Transmission gates are preferred as this loss is avoided—but at the expense of incurring more than 2× in area penalty. It is customary to provide a voltage restoring circuit such as 903. A typical prior art circuit uses one (or two) standard inverters and a weak pull-up PMOS device to restore the voltage level at output 920. Two major draw backs to these schemes are: (i) a weak PMOS leaker provides a current at output 919 that fights against the inputs 915-918 that drives a zero transition, thereby degrading the MUX performance, and (ii) the power consumption is high due to a leaker discharge path to ground until the feed-back circuit shuts the leaker off. Such issues are resolved in the active voltage restoring circuit shown in FIG. 9B that is used as circuit 903 in this invention.

Figure 9B:
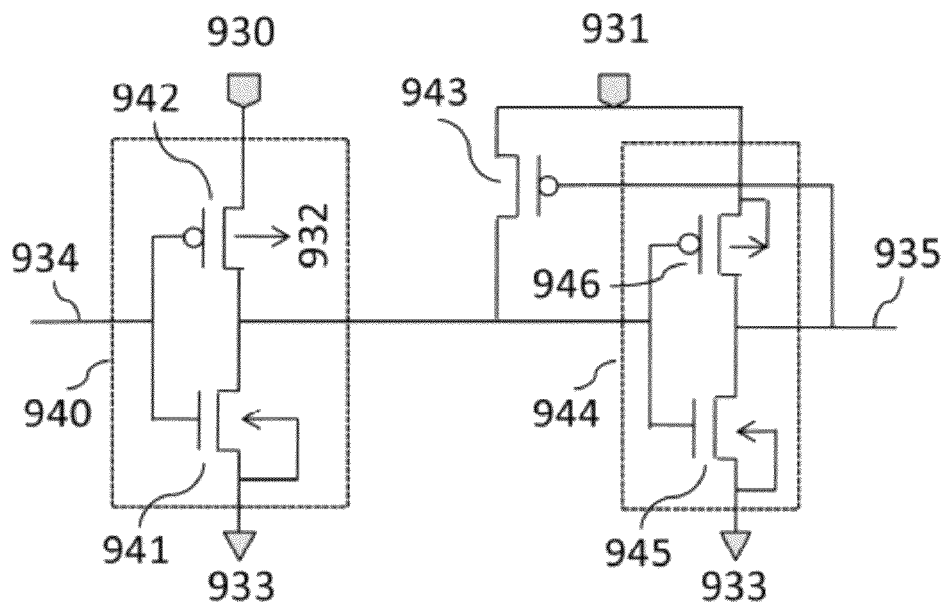
FIG. 9B shows detailed low power signal restoring circuit.

FIG. 9B shows a voltage restoring circuit 903 for use in this invention. It comprises a first inverter stage 940, a second inverter stage 944 and a weak PMOS pull-up (AKA leaker PMOS) 943. There are two input voltage levels at node 934 possible; solid zero, or degraded one (degraded by the Vt drop in NMOS MUX tree preceding inverter 940). Output 935 has fully restored logic one (when input 934 is at zero), and solid logic zero (when input 934 is at degraded one) voltage levels. The logic zero voltage level at node 919 in FIG. 9A is not degraded through the NMOS MUX tree. Inverter 940 is comprised of PMOS 942 and NMOS 941. The PMOS 942 is powered by a voltage level 930 which is at a lower level than a regular power supply voltage level. In this embodiment, the regular power supply voltage (termed $V_{DD}$) is shown as voltage 931. In one example $V_{DD}$ is 1.2 volts. In another example it is 1.0 volts. The voltage level 930 is set to be 0.1 volts, or 0.2 volts, or some other value, lower than $V_{DD}$ voltage level at 931. PMOS 942 is constructed inside an Nwell geometry; said Nwell has to be biased to a power supply voltage as well. In this embodiment, PMOS 942 resides in an Nwell that is biased to voltage level 932, which is at a higher voltage than the voltage level 930. In one example, voltage level 932 equals voltage level 931. In a second example, it may be higher than voltage level 931. The higher voltage level 932 (over and above voltage level 930) creates a body-effect for PMOS 942, which raises the threshold voltage (Vt). For example, if the normal PMOS 942 Vt is −0.10V, the body effect will raise the Vt to −0.15V, thereby improving the off-characteristics and leakage of PMOS. Hence even if the input voltage 934 is degraded by the NMOS Vt drop in NMOS MUX tree, PMOS 942 (powered by the lower power voltage 931 and having a higher PMOS Vt due to Nwell bias body-effect) is able to fully turn-off, thus eliminating steady PMOS off leakage current due to degraded input levels. This is a first advantage—lower power over traditional circuits. The input 934 is only coupled to high impedance gate electrodes of inverter 934; namely gates of 941 and 942. There is no competing current sources or sinks at this node. Thus in FIG. 9A, the regular inputs 915-918 of MUX tree only have to drive a high impedance node 919 through the MUX tree; thereby improving the MUX tree delay. This is a second advantage—higher performance over traditional circuits. The inverters 940 and 944 are sized to minimize the switching time. The output of first inverter 940 drives the second inverter 944, said output further coupled to a PMOS leaker. The PMOS leaker 943 is driven by output 935, thus receiving a feed-back signal to activate or deactivated 943. Inverter 944 is a regular inverter powered by power supply voltage level 931 and ground voltage level 933. Nwell of PMOS 946 is also coupled to power level 931. The input to inverter 944 is either at zero voltage level, or at least at a voltage level 930. When at zero voltage, the output 935 is at voltage level 931, which in turn shuts PMOS 943 leaker off, allowing the input to remain at zero level. When the input is at voltage level 930, output 935 goes towards zero turning PMOS 943 on—which pulls up said input level from voltage level 930 all the way up to voltage level 931. During this time the driver PMOS 942 of inverter 940 is in cut-off, and all the pull-up current is supplied by the leaker PMOS 943. This time interval is non-timing critical, and a low leaker current is sufficient to adjust the voltage level. To drive a zero at the input to inverter 944, NMOS 941 has to fight the PMOS leaker 943. PMOS leaker 943 is designed to have a very small on current by one or more of (but not limited to): narrow transistor width, long transistor channel length, high PMOS Vt, and thick gate dielectric. There are no NMOS pass-gates (like in a NMOS MUX tree) between the pull-down of NMOS 941, and pull-up of PMOS 943 making it easier for the input to inverter 944 to reach zero voltage level. The duration of power dissipation by PMOS leaker is the switching time for inverter 944, which is unaffected by the delays in the NMOS MUX tree preceding inverter 940. Thus FIG. 9B provides a faster and lower power voltage restoring circuit for use with NMOS MUX trees that comprise higher logic density.

A first embodiment of a novel local interconnects structure to generate highly efficient logic utilization is shown in FIG. 10. FIG. 10 is a more descriptive presentation of FIG. 7. In FIG. 10, elements 1001 and 1002 are logic units, each comprising a plurality of select inputs (such as 1011-1013), and a plurality of regular inputs (not shown, but such as 705-708 in FIG. 7), and one or more outputs (such as 1021 & 1026). In the shown embodiment, they represent 3-input LUT logic blocks. In other embodiments these may comprise n-inputs where n is an integer >1. In yet other embodiments, these logic units may be one or more of: NAND, NOR, MUX, ALU, XOR, Memory and Domino used to implement logic functions. A global interconnect switch box 1040 facilitates coupling input and output wires to the logic block inputs such as 1011-1018. In addition to global interconnect, local wires 1031-1038, and 1022-1025 further improve logic packing within the logic unit. The logic unit in FIG. 10 comprises a plurality of logic blocks (1001 and 1002), each comprising regular and/or select inputs and at least one output; and a plurality of MUX units (1003 and 1004), each comprising regular and/or select inputs and at least one output); and a interconnect structure having fixed interconnects (such as wires 1021-1026, 103-1037) and selectable interconnects (such as plurality of via 1050); wherein, the logic block outputs and the MUX inputs and the MUX outputs can be selectively coupled to a user specification by selecting a subset of the selectable geometries. In a preferred embodiment, interconnect 1023 is at zero voltage level, and interconnect 1024 is at one voltage level so that MUX's 1003 and 1004 can receive those values as regular or select inputs. The local interconnect structure in FIG. 10 shows 62 programmable 1050 geometries. An identical implementation using SRAM configuration bits and pass-gates point-to-point connections as shown in prior-art FPGA's is impractical as 62 SRAM bits and 62 MUXs would require 434 extra transistors (6*62+62) which adversely impact gate density and performance.

In summary, FIG. 10 shows a programmable logic unit of a semiconductor device, comprising: an interconnect structure (1010-1050) comprising: a plurality of fixed interconnects (1010-1040) including metal and via geometries; and a plurality of selectable interconnect geometries (1050), each selectable geometry coupling a said first fixed interconnect to a said second fixed interconnect; and a programmable logic block (1001) comprising a plurality of multiplexers, each multiplexer having a plurality of regular inputs (see 705-708 in FIG. 7), wherein each said regular input is selectively coupled to one of a zero state, a one state, a first input state, and the compliment of the first input state (see 741 in FIG. 7); and a programmable multiplexer (1003) having a plurality of regular inputs (1031, 1032), wherein each said regular inputs is selectively coupled to one of a zero state, a one state, and one or more input signals (1021-1026); wherein, selecting a subset of the selectable interconnect (1050) geometries program the logic block and the multiplexer regular inputs to implement a logic function.

A first advantage with this coupling is that the outputs of each logic block 1007 and 1008 (like outputs 920 of FIG. 9A) are buffered. The drive strength allow coupling those outputs to regular inputs 1031 & 1032 of MUX 1003, or a MUX pair 1003 & 1004 in series. A second advantage is that outputs of each logic block 1007 and 1008 can be coupled to regular inputs or select inputs of MUX blocks 1003 & 1004 thus enhancing the logic integration between logic blocks and MUX blocks. A third advantage is that regular inputs to 1003 and 1004 can be coupled to zero and one logic levels to generate a logic function, in addition to logic functions implemented in logic blocks 1007 and 1008. A fourth advantage is outputs of 1007 and 1008 can be coupled to regular inputs to MUX 1003 or 1004 to generate a 4-input logic function. A fifth advantage is that a 1007 output and a fixed constant (zero or one) can be fed into MUX 1003 or 1004 to generate a 4-input function, in addition to another 3-input function implemented in 1008. A sixth advantage is that a wide 7-input AND function (say ABCDEFG) can be generated by programming logic block 1001 to output "ABC"; MUX 1003 regular inputs as "ABC" and zero and D as select input to get "ABCD"; and logic block 1002 to output "EFG"; and MUX 1004 regular inputs as "ABCD" and zero and "EFG" as select input to get "ABCDEFG". A seventh advantage is that MUX's 1003 and 1004 can be coupled in a chain to generate carry-logic functions. For example, MUX 1003 is programmed to receive $C_i$ (carry-in) and A, as regular inputs, logic block 1001 is programmed to generate XOR of $A_i \oplus B_i$ as logic output which is coupled to select input of MUX 1001; wherein MUX 1003 generates $C_{i+1}$ (carry out) as output. MUX 1004 is programmed to receive $C_{i+1}$ (carry-in) and $A_{i+1}$ as regular inputs, logic block 1001 is programmed to generate XOR of $A_{i+1} \oplus B_{i+1}$ as logic output which is coupled to select input of MUX 1004; wherein MUX 1004 generates $C_{i+2}$ as output. In a preferred embodiment a metal track 1022 provides a metal programmable carry-path. The metal track 1022 is non-continuous; hence both the carry-in to MUX 1003 and carry-out of 1003 can occupy a single track, thereby improving metal interconnect efficiency. For the reasons mentioned above, and those of common knowledge to one familiar in the art, it is clear that a two logic block and two MUX logic unit shown in FIG. 10 can accommodate significantly more logic packing over prior-art logic structures to lower cost and improve performance at reduced power.

Figure 11C:
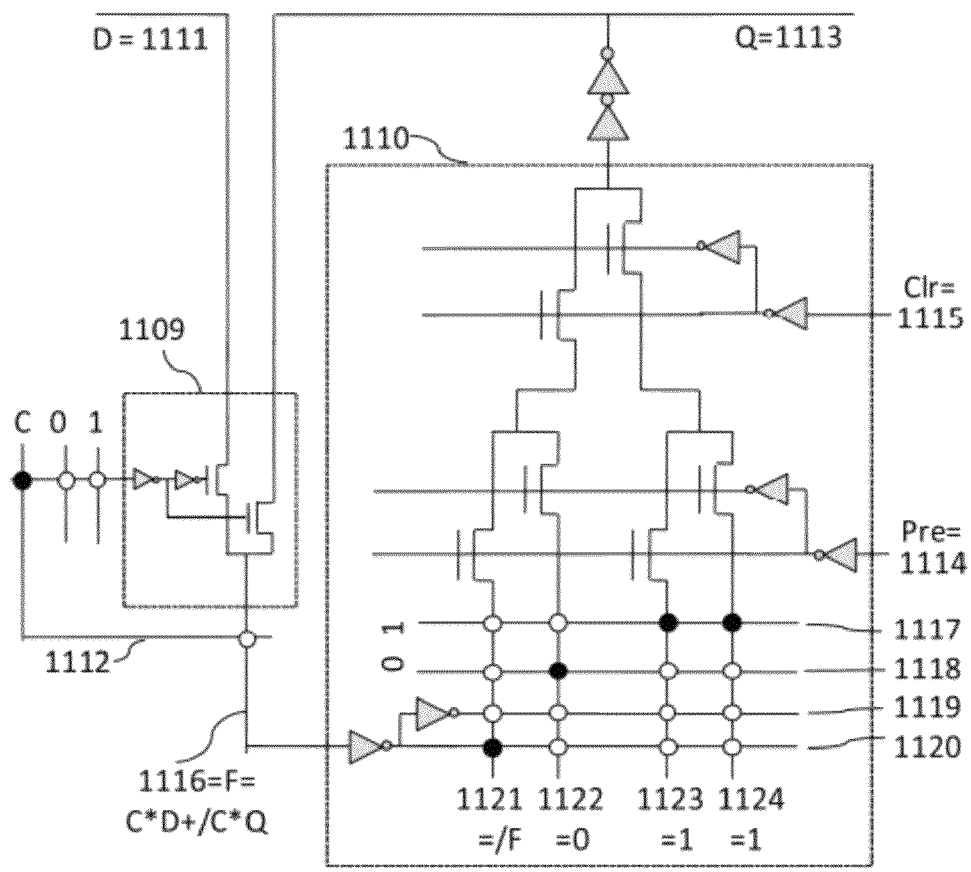

A metal programmable latch for implementation in the instant invention is shown in FIG. 11. FIG. 11A shows the symbol of a latch; the latch receiving a data input 1101, a clock input 1102, a preset input 1104, a clear input 1105 and a latched data output 1103. The preset and clear signals may be asynchronous or synchronous. Synchronous signals can be derived from generic asynchronous signals by gating same with clock or not clock signals. A latch generates a storage function based on data received at input 1101 when the clock is of a given polarity. When the clock is at opposite polarity, the stored value is retained in the latch. A truth table for a latch can be generated based on the desired output characteristics, and an example of such a truth table is shown in FIG. 11B. It is possible to generate different truth tables; for example, the data may be latched on positive or negative clock edge; preset may have priority over clear; or clear may have priority over preset. Implementation of such a latch in a building block comprising a single logic block 1110 and a single MUX 1109 is shown in FIG. 11C. Element 1110 is similar to 1001 in FIG. 10, and element 1109 is similar to 1003 in FIG. 10; and the shown connectivity is achieved by the selectable interconnect structure shown in FIG. 10. MUX 1109 receives data D input 1111 and latch stored Q input 1113 as regular inputs, and clock 1112 as the select input. Clock polarity is swapped in one of two methods. First, the clock or not-clock can be selected for input 1112 to change clock polarity desired. Second, to switch clock polarity, the two inputs D and Q coming into the MUX 1109 can be swapped. Both methods are achieved by selecting the appropriate programmable connections. Regular inputs 1121-1124 to logic block 1110 are configured to achieve the desired outputs shown in FIG. 11B. Clear 1115 is given priority; that is regardless of clock 1112 or preset 1114 states. This can be easily changed for preset to have priority over clear by adjusting the truth table FIG. 11B to reflect what is desired, and programming the inputs 1121-1124 of FIG. 11C accordingly.

A first advantage of a logic unit comprising logic block 1001 and MUX 1003 of FIG. 10 (as shown in FIG. 11C) is that, in a first configuration it can perform a latch function, and in a second configuration it can perform a logic function. This provides versatility to metal programmable logic whereby the user can implement storage and logic with a common silicon structure. A second advantage is that an automated design tool can synthesize a design and the placer can simply program the storage or logic into same cells without having to place different cells. A third advantage is that the silicon structure is repetitive and uniform in a sea of logic blocks, thus the manufacturing and yields are better over mix-and-match differing standard cells. Thus FIG. 10 comprises two such logic units shown in FIG. 11C.

Figure 12A:
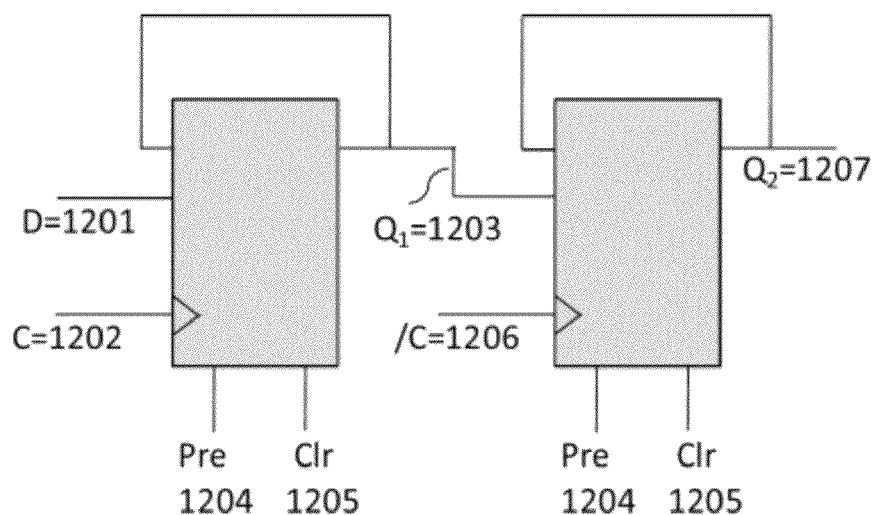
Figures 12B, 12C, 13A:
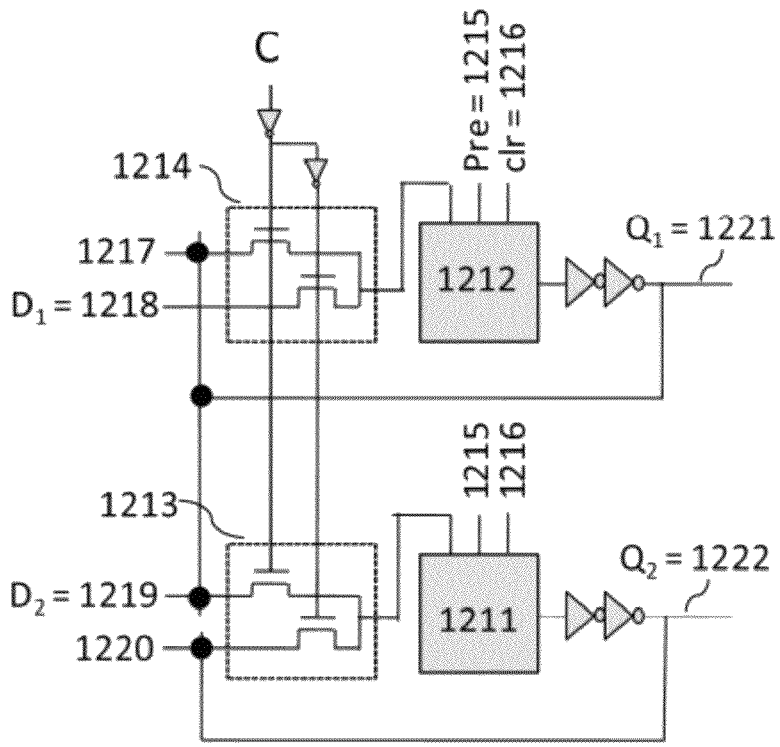

A metal programmable flip-flop for implementation in the instant invention is shown in FIG. 12. FIG. 12A shows the symbol of a flip-flop (FF); the FF receiving a data input 1201, a clock input 1202, a not-clock (IC) input 1206, a preset input 1204, a clear input 1205, a first latched $Q_1$ data output 1203 and a second latched $Q_2$ data output 1207. It is comprised of two latches as shown in FIG. 11. The data output $Q_1$ of first latch feeds as data input $D_2$ of second latch (1203). Preset and clear signals are common to both latches. One embodiment of a user required FF functionality is described in FIG. 12B, wherein asynchronous clear is given priority over asynchronous preset signal. Just as with latches, these signals can be made synchronous to the clock. It is understood that the clock and not-clock signal relationships satisfy flip-flop design needs. From FIG. 12B, it is seen that asserting clear=1 sets $Q_2$=0, while asserting preset=1 sets $Q_2$=1. When clock=1, data $D_1$ is latched to the first latch, while output $Q_2$ is retained in the second latch. When clock=0, output $Q_1$ is retained in the first latch, and output $Q_1$ is latched to the second latch. Thus in one clock cycle, data $D_1$ is first latched to master stage, and then to slave stage. Feed-through is avoided by proper clock design. It is further noted that user requirements might vary, but any variation can be shown in a table similar to FIG. 12B. Implementation of the FF functionality is shown in FIG. 12C. The flip-flop comprises a plurality of MUX elements (1213, 1214) and a plurality of logic elements (1211, 1212). It receives a data input 1218, and it generates two outputs; stored data $Q_2$ 1222, and stored not-data $Q_1$ 1221. MUX 1214 selects either $D_1$ 1218 or $Q_1$ 1217 as input to master latch 1212. MUX 1213 selects either $D_2$ 1219 or $Q_2$ 1222 as input to slave latch 1211. As master stage output $Q_1$ 1221 is coupled to data slave stage data in D2 1219, the output of master latch serves as data entry to slave latch.

A first advantage of the logic unit of FIG. 12C and FIG. 10 is that, in a first configuration it can perform a FF function, and in a second configuration it can perform a complex logic function. This provides versatility to metal programmable logic whereby the user can implement FF and logic with a common silicon structure. A second advantage is that an automated design tool can synthesize a design and the placer can simply program the FF or logic into same cells without having to place different cells. A third advantage is that the silicon structure is repetitive and uniform in a sea of logic blocks, thus the manufacturing and yields are better over mix-and-match differing standard cells.

Most SoC and ASIC products require memory and latches that serve storage, delay lines, register files, random write/read and multi-port user requirements. It is well known in the art that large memory blocks benefit from a repeating unit cell that can be arrayed, the array sharing common word-lines and common bit-lines. Such memory blocks may have irregular shapes compared to logic; therefore memory compilers generate a required memory configuration specified by the user; a floor-planner positions and hook-up the memory to the logic implemented in standard cells. With this invention, the logic is implemented in regular repeating metal-programmable logic structures as described earlier. Certain aspect ratio's of memory is not conducive to compact layout styles with repeating logic units. For example, a 32-bit shift-register (SR) spans 1-bit wide (narrow), but 32-bits long; a pencil like shape that is difficult to integrate with repeating rectangular cell structures. Furthermore, 32-bits generally require a minimum of 5-bit ($2^5$=32) decoding. 32 SRAM bits require 192 (=32*6) transistors. One 5-bit decode tree to generate 32 decoded patterns 00000, 00001, 00010, . . . , 11111 require 512 transistors when 2-input NAND gates are used; and 320 transistors if 5-input NAND gates are used. Thus the decode logic dominate the SR area, adding to the disruption in high gate density, power and performance.

A memory structure for use with metal programmable logic is disclosed next. To simplify the discussion, a 4-bit decode tree is shown in FIG. 13; however the concept can be extended to any number of bits. A 4-bit decode generates 16 decoded patterns as shown in the table in FIG. 13A. The 4-bits are designated A, B, C and D. The 16 entries in the table designate the decoded values. The 4-bits are arranged into 2-bits in a first dimension, and 2-bits in a second dimension. Any even-number N bits can be equally divided into N/2 bits in said first and second dimensions. Any odd-number of bits N can be divided into (N−1)/2 bits in the first dimension and (N+1)/2 bits in the second dimension. In the example in FIG. 13A, bits AB span rows of the table, while bits CD span columns of the table. Each column is designated a first variable $F_m$, where m is an integer 1 to 4. Each row is designated a second variable $G_n$, where n is an integer 1 to 4. Inspection of the entries in table in FIG. 13A show that each column $F_m$ has the first two bit values AB of the column heading; and each row $G_n$ has the bit values CD of the row heading. Thus a string of decode values ABCD is decomposed into a rectangular array by this method. In the array, each column has a unique value, same as the column heading; and each row has a unique value same as the row heading. FIG. 13B shows one embodiment of generating unique column heading $F_m$ values, and row heading $G_n$ values. $F_1$=0 if and only if A=0 and B=0; else $F_1$=1. Likewise, $F_2$=0 if and only if A=0 and B=1; else $F_2$=1. A common row line can carry the row heading values, and a common column line can carry the column heading values; which enables common column and row line construction for a string of decode bits. FIG. 13C shows a simple NOR gate 1310 that receives a column line 1301 and a row line 1302, said row and column lines as defined by FIG. 13B. The NOR gate 1310 output 1303 is defined as $R_{mn}$. The resulting $R_{mn}$ values for all possible $F_m$ and $G_n$ combinations are shown in FIG. 13D. It is easily observed that for a given set of ABCD values, there is one and only one $R_{mn}$ value that is one; all the remaining 15 values are at zero. For example, when A=1, B=0: $F_1$=1, $F_2$=1, $F_3$=0 and $F_4$=1. When C=0, D=1: $G_1$=1, $G_2$=0, $G_3$=1, and $G_4$=1. Thus only $R_{32}$=1, and all the remaining $R_{mn}$ values are zero. The NOR gate 1303 in FIG. 13C is common to every cell in the table; including it into a cell allows the construction of a cell-array comprising a common column and a common row; wherein the intersection of a row and a column contains a unique decode address. A first advantage of the decomposition technique described and shown in FIG. 13 enables converting a skinny-long memory block, such as a shift-register, to a rectangular block that is compact and integrates better with arrays of repeating logic cells. A second advantage is that it allows construction of a cell array, wherein each cell in the array comprises a unique decoded signal generated from common word-line and row-line signals. A third advantage is that it allows sharing of read and write signals by all the cells in the array as each cell is individually accessible.

Figure 14:
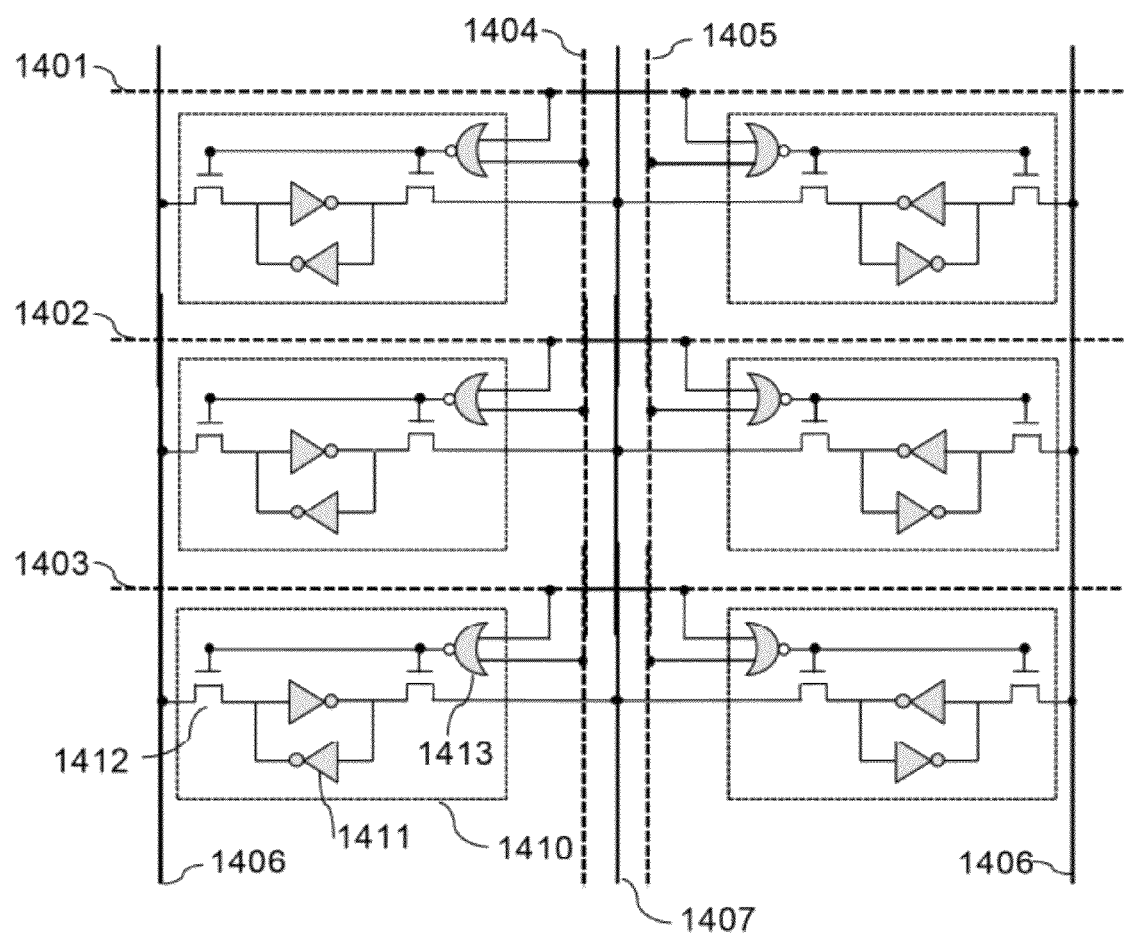
FIG. 14 shows a first embodiment of a memory array for small memory instantiations.

FIG. 14 shows an embodiment of a cell array constructed with the scheme described above. Cell 1410 is arrayed; in the illustration a 2×3 array is depicted for discussion purposes and the array is considered to be an N×M array where N and M are integers greater than two. Within cell 1410, an SRAM cell is shown for illustration purposes; however, this could be any other memory element such as a DRAM, EEPROM, EPROM, fuse, magnetic memory, electro-chemical, electro-magnetic, carbon nano-tube, phase-changing, or any other memory element. An SRAM cell comprises back-to-back inverters such as 1411 (the storage unit), and one or more access transistors such as 1412. For a DRAM cell, the storage unit is a capacitor, and there is only one access transistor. Also included in the cell is a logic unit 1413. This logic unit 1413 receives two inputs and generates one output. The inputs are arranged as a common row line 1403, and a common column line 1404. The output of 1413 couples the access device such as 1412, and is dedicated to individual cells. In the cell array, bit-lines 1406 and 1407 are shared by all the bits; thus adjacent bits can share a single metal track. A reduction in metal tracks for memory leaves more available tracks for metal programming, thereby improving packing density and routing. To write data to the array, 1406 is used as data signal, and 1407 is used as not_data signal. One of row lines 1401-1403 is at zero, while two of said row lines are at one. Similarly, one of column lines 1404-1405 is at zero, while the others are at one. The intersection cell comprising zero row line and zero column line is asserted, while all other cells are deselected. Thus the data supplied by the data lines 1406-1407 is written into the asserted cell. Similarly, a read operation reads a single cell asserted in a similar fashion, the read value obtained from the data lines 1406-1407. Thus memory block in FIG. 14 is a random access memory block, wherein any cell can be individually accessed to either write or read data. By duplicating logic unit 1413, duplicating column and row lines such as 1401-1405, and duplicating access devices 1412, FIG. 14 can be easily converted to a multi-port memory structure. Thus, the memory array of FIG. 14, comprises: a memory cell 1410 replicated in rows and columns to form an array; and a plurality of first horizontal decode signals (1401-1403), each horizontal signal common to all the memory cells in a said row; and a plurality of first vertical decode signals (1404, 1405), each vertical signal common to all the memory cells in a said column; wherein, said replicated memory cell 1410 further comprises: a storage device (having inverter 1411) to store data; and a first decode device (1413) to receive a said first horizontal decode signal (1403) and a said first vertical decode signal (1404) and generate a first local decode signal (coupled to gate of select device 1412) to access a first unique memory cell in the array.

Figure 15:
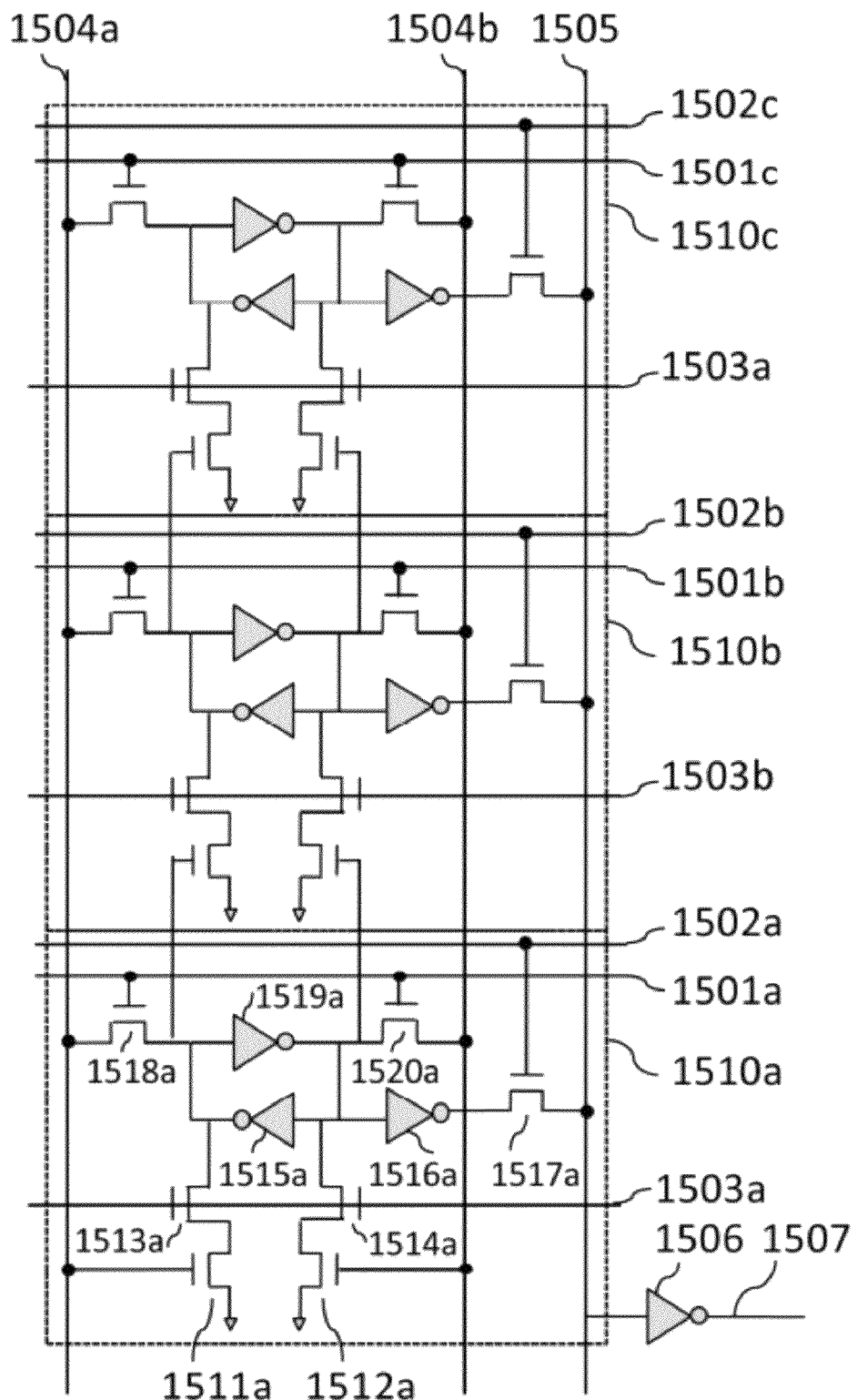
FIG. 15 shows a multi-port memory with a plurality of programmable modes.

A novel multi-port memory block adapted for a plurality of configurable usages is shown in FIG. 15. A primary advantage of this memory block is that it is versatile, and hence a single block arranged efficiently in a floor-plan is easier to integrate over multiple versions of different size blocks. FIG. 15 shows a repeating storage cell 1510, arranged in a column. While only 3-bits SRAM are shown for illustration purposes, there can be any number of N-bits, not limited to SRAM, where N is an integer greater than two. The bits are labeled a, b, c to designate the location from a starting $1^{st}$ position to an $N^{th}$ position in the column. The bit array comprises a random write port; common write_data 1504a and not_write_data 1504b (of opposite polarity to 1504a) provides data to be written into a cell, common write_select lines 1501 (one of which is selected by a write decode function) selects the bit to write new data, and access devices 1518a and 1518b enables the data write. A latch comprising back-to-back inverters 1515a and 1519a holds data. Through access devices 1518a and 1520a this data can be altered; the opposite polarity data write signals inputs 1504a, 1504b provide data levels zero and one, which are easily passed through the NMOS select gates 1518a, 1520a to set the latch as needed. As this is a symmetric operation, the two inverters 1515a and 1519a in the latch can be minimum size, identical inverters. The signal lines 1503a and 1503b are held at ground during write mode. An independent read port is provided to read data without disturbing data in the cell, as well as which allows the same cell to be written and read during the same clock cycle. The read_select lines are 1502; a specific read line is selected by a read decode function. The latch data is protected by inverter 1516a coupled to the latch during read; thus the read function does not disturb stored data, allowing the latch to be of minimum size to save area. Inverter 1516a is sized to drive the read_data 1505 line which is common to all the bits. The output on 1505 is buffered by inverter 1506, and received at port 1507. Data received at port 1507 has the same polarity as the bit selected by the plurality of read_select lines 1502. If the same bit is selected by the write_select 1501, and read_select 1502, new data written to cell 1510 is received at port 1507 after a hold-time interval that ensures data stability. A third shift port is also provided to the memory array. In this shift mode, data written to cell 1510a can be sequentially pushed to 1510b, 1510c, etc., using a shift signal 1503b, and not_shift signal 1503a (of opposite polarity to 1503b). During shift mode, all write_select lines 1501 are held at ground. Shift and not_shift signals prevent data feed-through and arrange the column of storage cells into flip-flop pairs comprising a master stage (such as 1510a) and a slave stage (such as 1510b). On negative shift when 1503a is high, data is latched from preceding slave stage to next master stage. For the first stage in the column, data is written from write_data lines 1504 to first slave stage 1510a. An advantage with the shift function is that data written from one-bit to the next-bit does not depend on the drive strength of the latch inverters. For example, the latch in 1510a activates the pass-gates 1511b and 1512b of cell 1510b. One of those two NMOS devices is on and one is off. When 1503b is asserted high, the latch in 1510b gets a discharge pull from one side, which flips the latch into the desired state. Thus the sizing on series pass-gates 1514b, 1512b, with respect to pull-up strength of 1519b determines how well the latch can flip during shift mode. The read mode does not affect the shift mode hence any bit in the column can be viewed after a shift operation. Thus the memory block shown in FIG. 15 can be configured as a random access memory block, or a shift-register. As previously mentioned, a skinny-long memory layout for a 64-bit shift-register is not conducive to compact layouts with other rectangular cells.

Figure 16A:
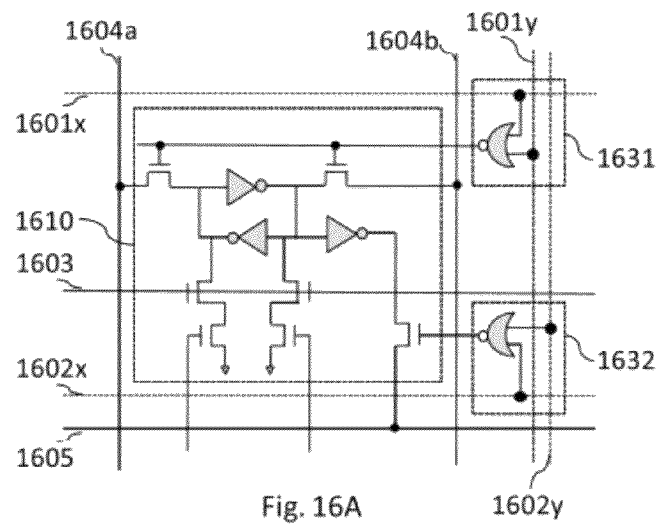
FIG. 16A-16B shows an array construction of multi-port multi-function memory.

A cell such as 1510 in FIG. 15 adapted to a rectangular construction as discussed in FIGS. 13 & 14 is shown in FIG. 16. FIG. 16A shows a single cell construction. Cell 1610 is similar to cell 1510 in FIG. 15. Write_data lines 1604a and 1604b are also similar to 1504a and 1504b respectively in FIG. 15. Read_data line 1605 is also similar to 1505 in FIG. 15. Functionality of these were described in FIG. 15, and hence not repeated here. The difference in the adaptation is that write_select 1501 of FIG. 15 is split into two signals; a horizontal_write_select signal 1601x and vertical_write_select 1601y. Similarly, the read_select 1502 of FIG. 15 is split into two signals; a horizontal_read_select signal 1602x and vertical_read_select 1602y. A first and second logic gate 1631, 1632 (each as 1413 of FIG. 14) provides a local select function based on common horizontal and vertical signals. Thus an individual cell is selected in an X-Y array of cells for writing into, or reading from a desired cell.

Figure 16B:
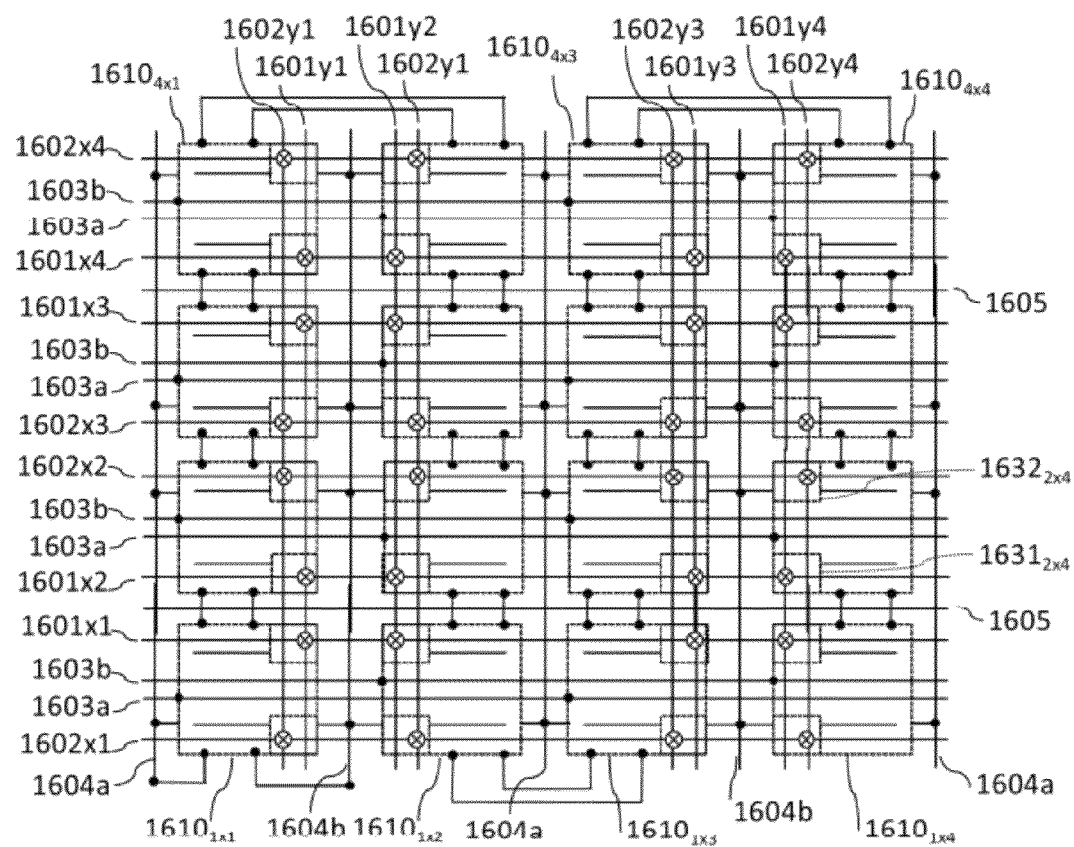

A 16-bit shift-register using cell in FIG. 16A, arranged in a 4×4 cell array is shown in FIG. 16B. The cell array comprises a plurality of horizontal_write_select lines 1601x, and a plurality of vertical_write_select lines 1601y. It further comprises a plurality of horizontal_read_select lines 1602x, and a plurality of vertical_read_select lines 1602y. A plurality of repeating cells 1610 are arrayed into the X-Y array. Within each cell, for example cell $1610_{2x4}$, a first logic block $1631_{2x4}$ couples to 1601x2 and 1601y4 to generate a local write-select signal. Within each cell, for example cell $1610_{2x4}$, a first logic block $1632_{2x4}$ couples to 1602x2 and 1602y4 to generate a local read-select signal. Thus a unique cell in the array is selected to write data or read data by the address lines. A common write_data pair 1604a, 1604b provides data to be stored in the array. A common read_data line 1605 outputs read data from the array. A pair of true-complement shift_data signal lines 1603b, 1603a allows the array to be connected into a shift-register mode. To facilitate shifting data, a serpentine pattern of cell coupling is provided. The first cell in the chain, cell $1610_{1x1}$, is directly coupled to write_data lines 1604. The second cell $1610_{2x1}$ is coupled to said first cell, and third cell $1610_{3x1}$ is coupled to said second cell, so on, until the last but one cell $1610_{2x4}$ is coupled to $1610_{1x4}$. The serpentine pattern could have been constructed in a column fashion (as shown in FIG. 16B) or in a row fashion. Shift_data signals in true (1603b) and compliment (1603a) are routed through the array as shown, and alternating cells are coupled to the shift_data signals to avoid feed-through. In the array of FIG. 16B, it is easily seen that adjacent rows or adjacent columns share common metal tracks for 1604a, 1604b and 1605. It is recognized that in an alternative construction, common shift lines 1603a and 1603b can also be shared by adjacent row lines (or column lines, if the direction of 1603 is column-wise.

Fabrication of MpC and MpP products include standard CMOS processing. First NMOS and PMOS transistors are fabricated on a silicon substrate layer using isolation, doping, deposition and photolithography techniques known in the art. Transistor threshold voltages and leakages are adjusted with doping, gate dielectric thickness and gate work-function adjustments. A first metal and first contact is used to contact source, drain, substrate and gate nodes. A plurality of metal to metal isolation dielectrics, dielectric polishing (CMP) steps, vias and metal layers are used for interconnects; and these techniques are known in the art. A plurality of masks used to fabricate the MpC is pre-defined, and contain no selectable geometries. One or more metal masks contain selectable geometries, and lend to customizing the MpC to a user specification.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A programmable buffer of a semiconductor device comprising:
   an input and an output; and
   a programmable interconnect structure comprising:
      a plurality of fixed interconnects including metal and via geometries; and
      a plurality of selectable interconnect geometries, wherein selecting a selectable geometry connects a first of said fixed interconnects to a second of said fixed interconnects;
      wherein said input and said output is configured to electrically connect to a subset of said fixed interconnects by the selectable interconnect geometries; and
   a programmable signal restoring unit comprising a plurality of transistors, at least one said transistor having:
      a common gate region and a common source region; and
      a first drain region coupled to the programmable buffer output comprising said fixed interconnect; and
      a second drain region comprising said fixed interconnect, said first and second drain regions isolated from each other, wherein said selectable geometry is configured to electrically connect the first and second drain regions;
   wherein, selecting a subset of the selectable interconnect geometries program the programmable buffer input and output connections, and the programmable buffer signal drive strength.

2. The device of claim 1, wherein said at least one transistor is one of an NMOS transistor and a PMOS transistor.

3. The device of claim 1, wherein said selectable interconnect geometry is one of a via geometry and a metal geometry.

4. The device of claim 1, wherein the selectable interconnect geometries further require a custom interconnect layer to fabricate the buffer, the custom interconnect layer comprising:
   a portion of said fixed interconnect geometries; and
   the subset of said selectable interconnect geometries, said subset selected by a computer aided design tool by the use of a binary bit of said binary bitstream, said binary bit comprising a one state to select the selectable geometry and a zero state to omit the selectable geometry;
   wherein the custom interconnect layer program the programmable buffer during fabrication of the semiconductor device.

5. The device of claim 1, further comprising:
   a first configuration wherein the programmable buffer comprises a first signal drive strength; and
   a second configuration wherein the programmable buffer comprises a second signal drive strength greater than said first drive strength.

6. The device of claim 1, wherein the fixed interconnect geometries further require at least one interconnect layer to fabricate the programmable buffer wherein there are no selectable interconnect geometries.

7. The device of claim 1, wherein said signal restoring unit further comprising:
   a first inverter having an input and an output, wherein the programmable buffer input is coupled to the first inverter input; and a second inverter having an input and an output, wherein the first inverter output is coupled to the second inverter input, and the second inverter output is coupled to the programmable buffer output.

8. The device of claim 1, wherein said at least one transistor of the restoring unit further comprising:
an $N^{th}$ isolated drain region, where N is an integer greater than two, the $N^{th}$ drain region coupled to a said fixed interconnect, wherein said first, second and $N^{th}$ drain regions is configured to electrically connect to each other by selecting a subset of said selectable geometries.

9. A programmable buffer of a semiconductor device, comprising:
a plurality of fixed interconnect geometries and a plurality of selectable interconnect geometries, wherein selecting a selectable geometry connects a first of said fixed interconnects to a second of said fixed interconnects; and
a programmable buffer comprising:
an input and an output, the input and the output capable of connecting to a subset of said fixed interconnects by a subset of said selectable interconnect geometries; and
a plurality of inverters coupled to the programmable buffer input and the programmable buffer output, a first of said inverter comprising a first transistor comprised of a plurality of isolated drain nodes, wherein the drain nodes is configured to be connected to each other by selecting a subset of said selectable interconnect geometries; and
a computer aided design tool that identifies a binary bitstream, a binary bit of said binary bitstream having a one state to select the selectable geometry, and a zero state to omit the selectable geometry, the bitstream identifying the selectable geometries to program the programmable buffer input and output connections, and the programmable buffer drive strength; and
a fabrication process utilizing a plurality of common interconnect layers and a custom interconnect layer to fabricate the device, the custom interconnect layer comprising a subset of said fixed interconnect geometries and the bitstream selected selectable interconnect geometries to program the programmable buffer.

10. The device of claim 9, wherein said first transistor is one of an NMOS transistor and a PMOS transistor.

11. The device of claim 9, wherein said custom interconnect layer comprises one of a via layer and a metal layer.

12. The device of claim 9, further comprising:
a first bitstream to insert the programmable buffer having a first strength between a first and second of said fixed interconnects; and
a second bitstream to insert the programmable buffer having a second strength between a third and fourth of said fixed interconnects.

13. The device of claim 9, wherein said first transistor further comprises:
a common gate node receiving an input signal, a common source node providing a fixed source voltage, wherein a first portion of the transistor on current is supplied to the first drain, and wherein a second portion of the transistor on current is supplied to the second drain.

14. The device of claim 9, wherein the first inverter further comprises:
a second transistor comprised of a plurality of isolated drain nodes, wherein the drain nodes are configured to be connected to each other by selecting a subset of said selectable interconnect geometries, and wherein said first and second transistors have opposite channel conductivity.

15. A programmable interconnect structure of a semiconductor device, comprising:
a plurality of programmable interconnects comprising:
a plurality of fixed interconnects including metal and via geometries; and
a plurality of selectable interconnect geometries, wherein selecting a selectable geometry connects a first said fixed interconnects to a second said fixed interconnects; and
a plurality of programmable buffers, each programmable buffer comprising:
an input, wherein selecting a subset of said selectable interconnect geometries connect the input to one of a subset of said fixed interconnects; and
an output, wherein selecting a subset of said selectable interconnect geometries connect the output to one of a subset of said fixed interconnects; and
a plurality of inverters, a first of said inverters having a first transistor comprised of:
a first drain region coupled to the programmable buffer output; and
a second drain region isolated from said first drain region, wherein selecting said selectable geometry connects the second drain region to the first drain region to increase the drive strength of the programmable buffer;
wherein, selecting a subset of the selectable interconnect geometries program the programmable interconnect structure to a customer specification.

16. The device of claim 15, wherein said first transistor is one of an NMOS transistor and a PMOS transistor.

17. The device of claim 15, wherein said selectable geometry is one of a via geometry and a metal geometry.

18. The device of claim 15, wherein the selectable interconnect geometries further require a custom interconnect layer to fabricate the interconnect structure, the custom interconnect layer comprising:
a portion of said fixed interconnect geometries; and
a subset of selectable interconnect geometries, said subset selected by a computer aided design tool by the use of a binary bitstream, a binary bit of said binary bitstream comprising a one state to select the selectable geometry and a zero state to omit the selectable geometry;
wherein the custom interconnect layer program the interconnect structure during fabrication of the semiconductor device.

19. The device of claim 15, further comprising:
a first instance wherein a single buffer having a first strength is positioned between a first and second of said fixed interconnects; and
a second instance wherein a plurality of buffer having a second strength is positioned between a third and fourth of said fixed interconnects.

20. The device of claim 15, wherein the first inverter of each buffer further comprises:
a second transistor comprised of a plurality of isolated drain nodes, wherein the first and second transistor drain nodes are configured to be connected to each other by selecting a subset of said selectable interconnect geometries, and wherein said first and second transistors have opposite channel conductivity.

* * * * *